United States Patent
Huang

(10) Patent No.: US 11,211,316 B1
(45) Date of Patent: Dec. 28, 2021

(54) WIRING STRUCTURE AND METHOD FOR MANUFACTURING THE SAME

(71) Applicant: Advanced Semiconductor Engineering, Inc., Kaohsiung (TW)

(72) Inventor: Wen Hung Huang, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 0 days.

(21) Appl. No.: 17/030,170

(22) Filed: Sep. 23, 2020

(51) Int. Cl.
*H01L 23/498* (2006.01)
*H01L 21/48* (2006.01)

(52) U.S. Cl.
CPC ...... *H01L 23/49822* (2013.01); *H01L 21/486* (2013.01); *H01L 21/4857* (2013.01); *H01L 23/49833* (2013.01); *H01L 23/49838* (2013.01)

(58) Field of Classification Search
CPC ........... H01L 23/49822; H01L 21/4857; H01L 21/486; H01L 23/49833
USPC ........................................ 174/262
See application file for complete search history.

(56) References Cited

U.S. PATENT DOCUMENTS

| 6,413,620 B1* | 7/2002 | Kimura | H05K 3/20 174/251 |
| 6,596,384 B1* | 7/2003 | Day | H05K 1/0242 174/250 |
| 2004/0191491 A1* | 9/2004 | Sugaya | H05K 3/382 428/209 |
| 2015/0021084 A1* | 1/2015 | Ko | H05K 3/4652 174/262 |

\* cited by examiner

*Primary Examiner* — Sherman Ng
(74) *Attorney, Agent, or Firm* — Foley & Lardner LLP

(57) ABSTRACT

A wiring structure and a method for manufacturing the same are provided. The wiring structure includes a conductive structure and at least one conductive through via. The conductive structure includes a plurality of dielectric layers and a plurality of circuit layers in contact with the dielectric layers. The conductive through via extends through at least a portion of the conductive structure. At least one of the circuit layers includes a first portion in contact with the conductive through via and a second portion in contact with the dielectric layer. A surface roughness of the first portion of the circuit layer is greater than a surface roughness of the second portion of the circuit layer.

20 Claims, 38 Drawing Sheets

WIRING STRUCTURE AND METHOD FOR MANUFACTURING THE SAME

BACKGROUND

1. Field of the Disclosure

The present disclosure relates to a wiring structure and a manufacturing method, and to a wiring structure including at least one conductive through via, and a method for manufacturing the same.

2. Description of the Related Art

Along with the rapid development in electronics industry and the progress of semiconductor processing technologies, semiconductor chips are integrated with an increasing number of electronic components to achieve improved electrical performance and additional functions. Accordingly, the semiconductor chips are provided with more input/output (I/O) connections. To manufacture semiconductor packages including semiconductor chips with an increased number of I/O connections, circuit layers of semiconductor substrates used for carrying the semiconductor chips may correspondingly increase in size. Thus, a thickness and a warpage of the semiconductor substrate may correspondingly increase, and a yield of the semiconductor substrate may decrease.

SUMMARY

In some embodiments, a wiring structure includes a conductive structure and at least one conductive through via. The conductive structure includes a plurality of dielectric layers and a plurality of circuit layers in contact with the dielectric layers. The conductive through via extends through at least a portion of the conductive structure. At least one of the circuit layers includes a first portion in contact with the conductive through via and a second portion in contact with the dielectric layer. A surface roughness of the first portion of the circuit layer is greater than a surface roughness of the second portion of the circuit layer.

In some embodiments, a wiring structure includes a lower conductive structure, an upper conductive structure and at least one conductive through via. The lower conductive structure includes at least one dielectric layer and at least one circuit layer in contact with the dielectric layer. The upper conductive structure is disposed on the lower conductive structure, and includes a plurality of dielectric layers and a plurality of circuit layers in contact with the dielectric layers. The conductive through via extends through at least a portion of the upper conductive structure, and terminates on the circuit layer of the lower conductive structure. At least one of the circuit layers of the upper conductive structure includes a first portion in contact with the conductive through via and a second portion in contact with the dielectric layer of the upper conductive structure. A surface roughness of the first portion of the circuit layer of the upper conductive structure is greater than a surface roughness of the second portion of the circuit layer of the upper conductive structure.

In some embodiments, a method for manufacturing a wiring structure includes: (a) attaching an upper conductive structure to a lower conductive structure, wherein the lower conductive structure includes at least one dielectric layer and at least one circuit layer in contact with the dielectric layer, and the upper conductive structure includes a plurality of dielectric layers, a plurality of circuit layers in contact with the dielectric layers, and a plurality of stacking portions connecting one another; (b) removing the stacking portions to form at least one through hole; (c) removing portions of the dielectric layers of the upper conductive structure to enlarge the through hole to form at least one accommodating hole, wherein a first portion of at least one of the circuit layers of the upper conductive structure is exposed in the accommodating hole; and (d) forming at least one conductive through via in the accommodating hole to extend through the upper conductive structure and contact the first portion of the circuit layer of the upper conductive structure, wherein the at least one conductive through via further contacts the circuit layer of the lower conductive structure.

BRIEF DESCRIPTION OF THE DRAWINGS

Aspects of some embodiments of the present disclosure are best understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
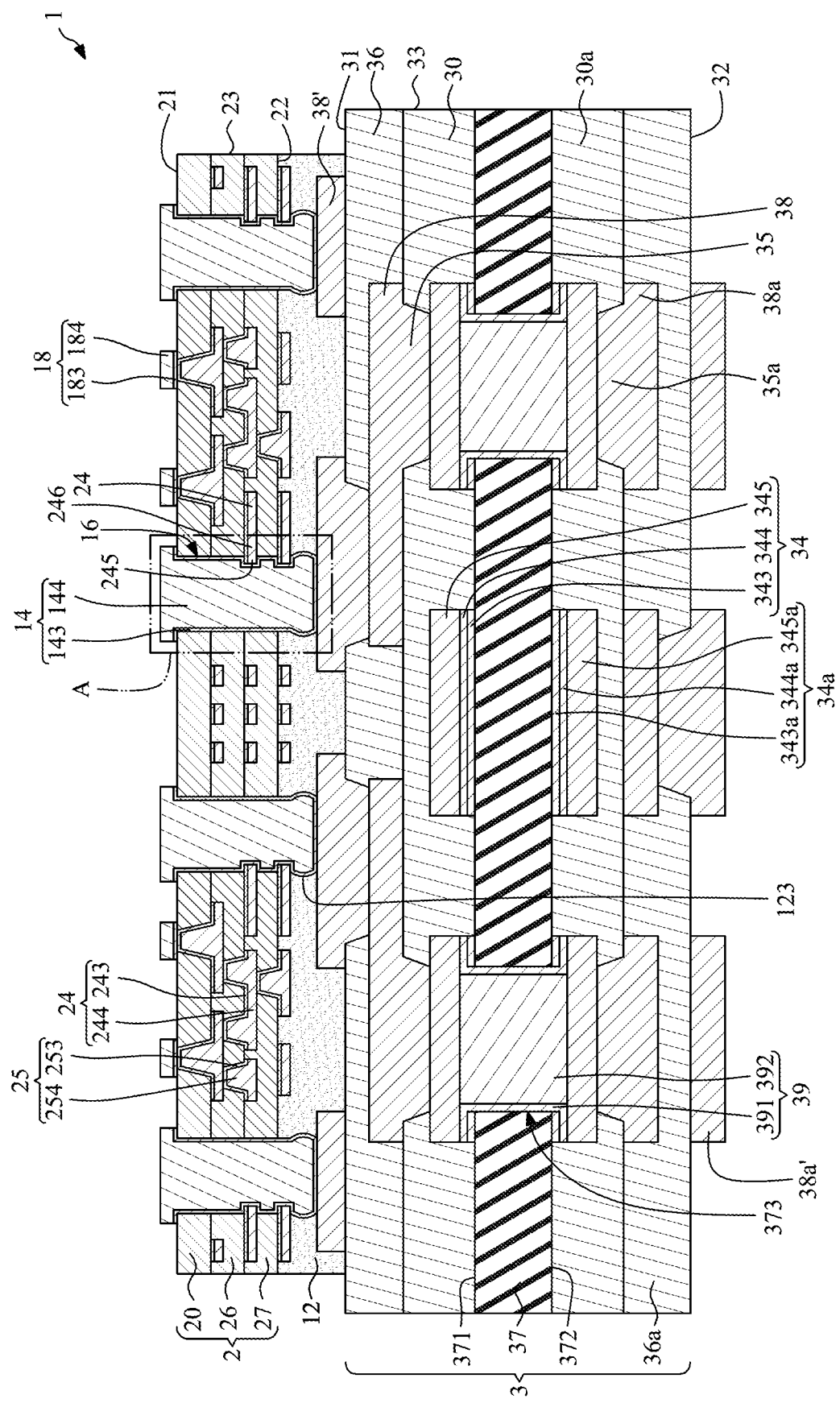
FIG. 1 illustrates a cross-sectional view of a wiring structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 2:
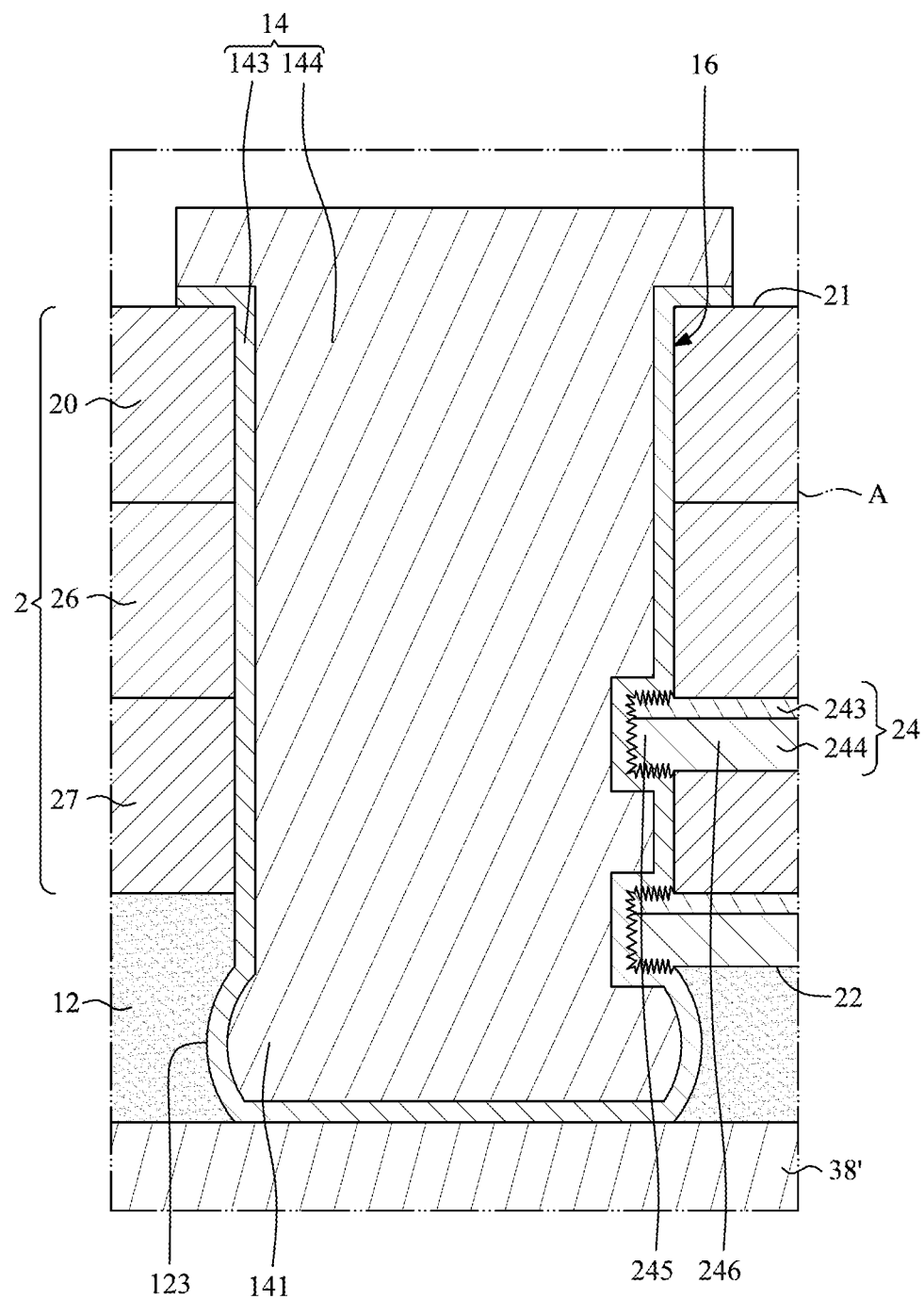
FIG. 2 illustrates a partially enlarged view of a region "A" in FIG. 1.
Figure 3:
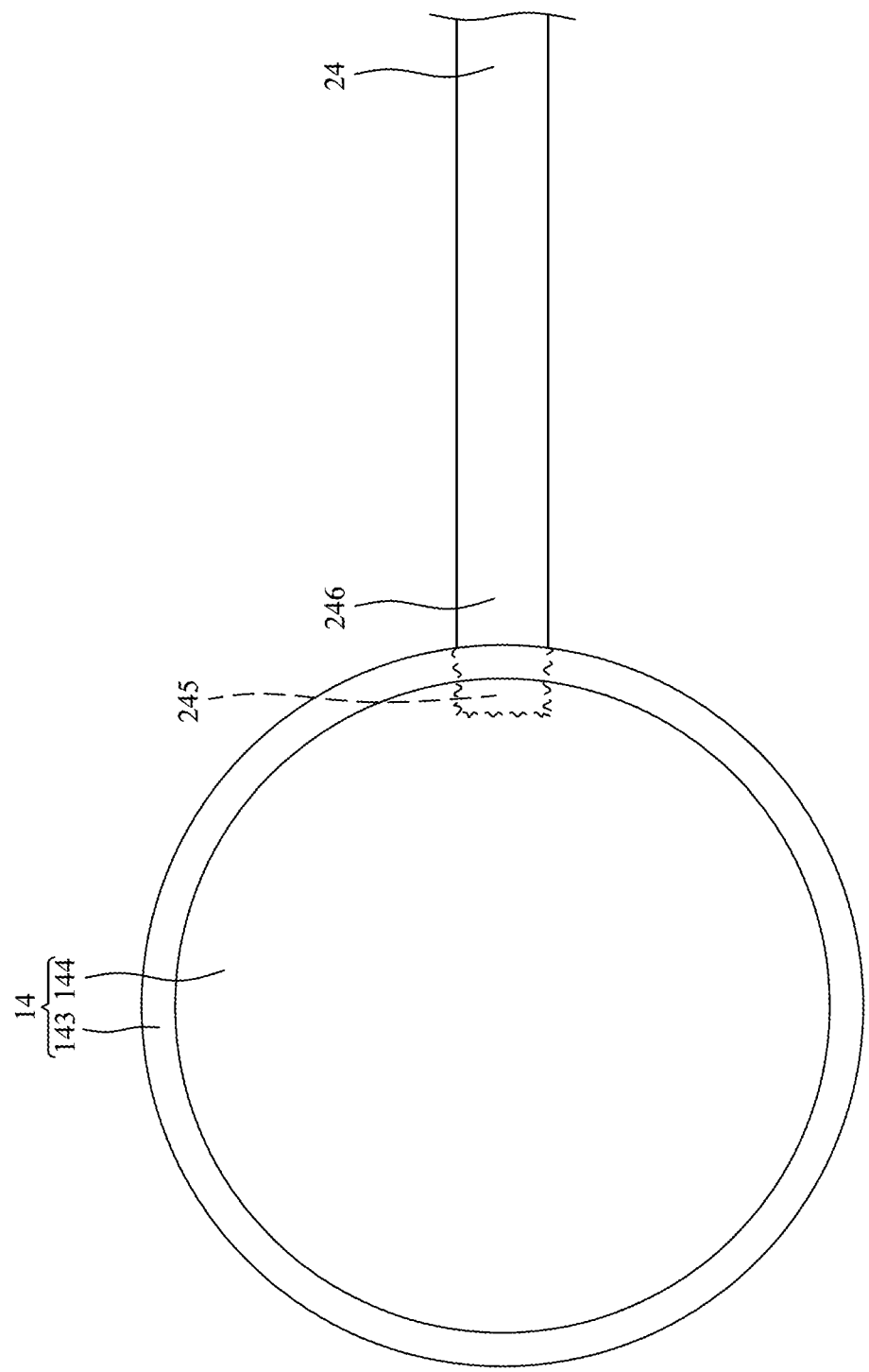
FIG. 3 illustrates a top view of FIG. 2, wherein a first dielectric layer, a second dielectric layer and an outer circuit layer are omitted.

FIG. 1 illustrates a cross-sectional view of a wiring structure 1 according to some embodiments of the present disclosure. FIG. 2 illustrates a partially enlarged view of a region "A" in FIG. 1. FIG. 3 illustrates a top view of FIG. 2, wherein the first dielectric layer 20, the second dielectric layer 26 and the outer circuit layer 18 are omitted. The wiring structure 1 may include an upper conductive structure (e.g., a conductive structure) 2, at least one conductive through via 14 and an outer circuit layer 18. In some embodiments, the wiring structure 1 may further include an intermediate layer 12 and a lower conductive structure 3.

The upper conductive structure 2 is disposed on the lower conductive structure 3, and includes a plurality of dielectric layers (including, for example, a first dielectric layer 20, a second dielectric layer 26 and a third dielectric layer 27), a plurality of circuit layers 24 (formed of a metal, a metal alloy, or other conductive material) in contact with the dielectric layers 20, 26, 27, and a plurality of inner conductive vias 25. In some embodiments, the upper conductive structure 2 may be similar to a coreless substrate, and may be a bumping level redistribution structure. The upper conductive structure 2 may be also referred to as "a high-density conductive structure" or "a high-density stacked structure". The circuit layers 24 of the upper conductive structure 2 may be also referred to as "a high-density circuit layer". In some embodiments, a density of a circuit line (including, for example, a trace or a pad) of the high-density circuit layer is greater than a density of a circuit line of a low-density circuit layer. That is, the count of the circuit line (including, for example, the trace or the pad) in a unit area of the high-density circuit layer is greater than the count of the circuit line in an equal unit area of the low-density circuit layer, such as about 1.2 times or greater, about 1.5 times or greater, or about 2 times or greater, or about 3 times or greater. Alternatively, or in combination, a line width/line space (L/S) of the high-density circuit layer is less than an L/S of the low-density circuit layer, such as about 90% or less, about 50% or less, or about 20% or less. Further, the conductive structure that includes the high-density circuit layer may be designated as the "high-density conductive structure", and the conductive structure that includes the low-density circuit layer may be designated as a "low-density conductive structure".

The upper conductive structure 2 has a top surface 21, a bottom surface 22 opposite to the top surface 21, and a lateral surface 23 extending between the top surface 21 and the bottom surface 22. As shown in FIG. 1, the dielectric layers 20, 26, 27 are stacked on one another. For example, the first dielectric layer 20 may be the topmost dielectric layer. In some embodiments, a material of the dielectric layers 20, 26, 27 is transparent, and can be seen through or detected by human eyes or machine. In some embodiments, a transparent material of the dielectric layers 20, 26, 27 has a light transmission for a wavelength in the visible range (or other pertinent wavelength for detection of a mark) of at least about 60%, at least about 70%, or at least about 80%. In some embodiments, a material of the dielectric layers 20, 26, 27 may be made of a cured photoimageable dielectric (PID) material such as epoxy or polyimide (PI) including photoinitiators.

The circuit layers 24 may be fan-out circuit layers or redistribution layers (RDLs), and an L/S of the circuit layer 24 may be less than about 10 µm/10 µm, less than or equal to 8 µm/8 µm, less than or equal to 5 µm/5 µm, less than or equal to 3 µm/3 µm, less than or equal to about 2 µm/about 2 µm, or less than or equal to about 1.8 µm/about 1.8 µm. In some embodiments, the circuit layer 24 is embedded in or is disposed on the corresponding dielectric layers 20, 26, 27. In some embodiments, each circuit layer 24 may include a seed layer 243 and a conductive material 244 (e.g., a plating metallic material) disposed on the seed layer 243. As shown in FIG. 1, the bottommost circuit layer 24 is disposed on and protrudes from the bottom surface 22 of the upper conductive structure 2 (e.g., the bottom surface of the third dielectric layer 27). As illustrated in the embodiment of FIG. 1, a horizontally connecting or extending circuit layer is omitted in the first dielectric layer 20.

Some of the inner conductive vias 25 are disposed between two adjacent circuit layers 24 for electrically connecting the two circuit layers 24. Some of the inner conductive vias 25 are exposed from the top surface 21 of the upper conductive structure 2 (e.g., the top surface of the first dielectric layer 20). In some embodiments, each inner conductive via 25 may include a seed layer 253 and a conductive material 254 (e.g., a plating metallic material) disposed on the seed layer 253. Each inner conductive via 25 tapers upwardly along a direction from the bottom surface 22 towards the top surface 21 of the upper conductive structure 2.

As shown in FIG. 1 and FIG. 2, the dielectric layers 20, 26, 27 of the upper conductive structure 2 together define an accommodating hole 16 extending through the dielectric layers 20, 26, 27. In addition, at least one of the circuit layers 24 includes a first portion 245 and a second portion 246. The first portion 245 may extend into the accommodating hole 16. The second portion 246 may be in contact with the dielectric layers 20, 26, 27. For example, the second portion 246 may be interposed between two of the dielectric layers 20, 26, 27. As shown in FIG. 2, a surface roughness of the first portion 245 of the circuit layer 24 is greater than a surface roughness of the second portion 246 of the circuit layer 24. For example, the surface roughness of the first portion 245 of the circuit layer 24 may be greater than two times, three times, five times or ten times the surface roughness of the second portion 246 of the circuit layer 24. In some embodiments, the surface roughness (Rz) of the first portion 245 of the circuit layer 24 may be about 0.1 µm to about 0.3 µm, and the surface roughness (Rz) of the second portion 246 of the circuit layer 24 may be about 0.01 µm to about 0.05 µm.

In addition, a grain size of a surface material disposed in the first portion 245 and adjacent to a surface of the first portion 245 of the circuit layer 24 is greater than a grain size of a surface material disposed in the second portion 246 and adjacent to a surface of the second portion 246 of the circuit layer 24. In some embodiments, a thickness of the surface material of the first portion 245 may be about 0.5 µm, and a thickness of the surface material of the second portion 246 may be about 0.5 µm. In some embodiments, the first portion 245 of the circuit layer 24 may be a power trace (or power segment) or ground trace (or ground segment). That is, the first portion 245 of the circuit layer 24 may be use for powering or grounding.

The conductive through via 14 is disposed in and fills the accommodating hole 16. Thus, the conductive through via 14 may extend through the conductive structure 2, and the first portion 245 of the circuit layer 24 may be in contact with the conductive through via 14. Thus, the conductive through via 14 is electrically connected to the circuit layer 24 through the first portion 245. In some embodiments, the first portion 245 of the circuit layer 24 may be embedded in the conductive through via 14. Alternatively, the first portion 245 of the circuit layer 24 may insert into the conductive through via 14.

The conductive through via 14 may be a monolithic or one-piece structure. A peripheral side surface of the conductive through via 14 may be a continuous or smooth surface that may be perpendicular to the top surface 21 of the upper conductive structure 2. In some embodiments, the conductive through via 14 may include a seed layer 143 and a conductive material 144 (e.g., a plating metallic material such as copper). The seed layer 143 is interposed between the conductive material 144 of the conductive through via 14 and the sidewall of the accommodating hole 16. Further, the seed layer 143 may cover the first portion 245 of the circuit layer 24. In some embodiments, the conductive material 144 of the conductive through via 14 may be different from the conductive material 244 of the circuit layer 24. For example, the conductive material 144 of the conductive through via 14 may include copper-iron composite, and the conductive material 244 of the circuit layer 24 may include copper sulfate. In addition, a lattice of the conductive material 144 of the conductive through via 14 may be different form a lattice of the conductive material 244 of the circuit layer 24. A grain size of the conductive material 144 of the conductive through via 14 may be greater than a grain size of the conductive material 244 of the circuit layer 24.

The outer circuit layer 18 is disposed on the top surface 21 of the upper conductive structure 2, and may be formed concurrently with the conductive through via 14. In some embodiments, the outer circuit layer 18 may include a seed layer 183 and a conductive material 184 (e.g., a plating metallic material such as copper). The seed layer 183 is interposed between the conductive material 184 and the top surface 21 of the upper conductive structure 2. The seed layer 183 of the outer circuit layer 18 and the seed layer 143 of the conductive through via 14 may be the same layer. The conductive material 184 of the outer circuit layer 18 and the conductive material 144 of the conductive through via 14 may be the same layer.

The lower conductive structure 3 includes at least one dielectric layer (including, for example, one first upper dielectric layer 30, one second upper dielectric layer 36, one first lower dielectric layer 30a and one second lower dielectric layer 36a) and at least one circuit layer (including, for example, one first upper circuit layer 34, two second upper circuit layers 38, 38', one first lower circuit layer 34a and two second lower circuit layers 38a, 38a' formed of a metal, a metal alloy, or other conductive material) in contact with the dielectric layer (e.g., the first upper dielectric layer 30, the second upper dielectric layer 36, the first lower dielectric layer 30a and the second lower dielectric layer 36a). In some embodiments, the lower conductive structure 3 may be similar to a core substrate that further includes a core portion 37. The lower conductive structure 3 may be also referred to as "a lower stacked structure" or "a low-density conductive structure" or "a low-density stacked structure". The circuit layer (including, for example, the first upper circuit layer 34, the two second upper circuit layers 38, 38', the first lower circuit layer 34a and the two second lower circuit layers 38a, 38a') of the lower conductive structure 3 may be also referred to as "a low-density circuit layer". As shown in FIG. 1, the lower conductive structure 3 has a top surface 31, a bottom surface 32 opposite to the top surface 31, and a lateral surface 33 extending between the top surface 31 and the bottom surface 32. The lower conductive structure 3 may include a plurality of dielectric layers (for example, the first upper dielectric layer 30, the second upper dielectric layer 36, the first lower dielectric layer 30a and the second lower dielectric layer 36a), a plurality of circuit layers (for example, the first upper circuit layer 34, the two second upper circuit layers 38, 38', the first lower circuit layer 34a and the two second lower circuit layers 38a, 38a') and at least one inner conductive via (including, for example, a plurality of upper interconnection vias 35 and a plurality of lower interconnection vias 35a). As shown in FIG. 1, the lateral surface 23 of the upper conductive structure 2 may be displaced or recessed from the lateral surface 33 of the lower conductive structure 3.

The core portion 37 has a top surface 371 and a bottom surface 372 opposite to the top surface 371, and defines a plurality of through holes 373 extending through the core portion 37. An interconnection via 39 is disposed or formed in each through hole 373 for vertical connection. In some embodiments, the interconnection via 39 includes a base metallic layer 391 and an insulation material 392. The base metallic layer 391 is disposed or formed on a side wall of the through hole 373, and defines a central through hole. The insulation material 392 fills the central through hole defined by the base metallic layer 391. In some embodiments, the interconnection via 39 may omit the insulation material 392, and may include a bulk metallic material that fills the first through hole 373.

The first upper dielectric layer 30 is disposed on the top surface 371 of the core portion 37. The second upper dielectric layer 36 is stacked or disposed on the first upper dielectric layer 30. In addition, the first lower dielectric layer 30a is disposed on the bottom surface 372 of the core portion 37. The second lower dielectric layer 36a is stacked or disposed on the first lower dielectric layer 30a.

A thickness of each of the dielectric layers 20, 26, 27 of the upper conductive structure 2 is less than or equal to about 40%, less than or equal to about 35%, or less than or equal to about 30% of a thickness of each of the dielectric layers 30, 36, 30a, 36a of the lower conductive structure 3. For example, a thickness of each of the dielectric layers 20, 26, 27 of the upper conductive structure 2 may be less than or equal to about 7 μm, and a thickness of each of the dielectric layers 30, 36, 30a, 36a of the lower conductive structure 3 may be about 40 μm. In addition, a material of the dielectric layers 30, 36, 30a, 36a of the lower conductive structure 3 may be different from the material of the dielectric layers 20, 26, 27 of the upper conductive structure 2. For example, the material of the dielectric layers 30, 36, 30a, 36a of the lower conductive structure 3 may be polypropylene (PP) or ajinomoto build-up film (ABF).

An L/S of the first upper circuit layer 34 may be greater than or equal to about 10 μm/about 10 μm. Thus, the L/S of the first upper circuit layer 34 may be greater than or equal to about five times the L/S of the circuit layer 24 of the upper conductive structure 2. In some embodiments, the first upper circuit layer 34 is formed or disposed on the top surface 371 of the core portion 37, and covered by the first upper dielectric layer 30. In some embodiments, the first upper circuit layer 34 may include a first metallic layer 343, a second metallic layer 344 and a third metallic layer 345. The first metallic layer 343 is disposed on the top surface 371 of the core portion 37, and may be formed from a copper foil (e.g., may constitute a portion of the copper foil). The second metallic layer 344 is disposed on the first metallic layer 343, and may be a plated copper layer. The third metallic layer 345 is disposed on the second metallic layer 344, and may be another plated copper layer. In some embodiments, the third metallic layer 345 may be omitted.

An L/S of the second upper circuit layer 38 may be greater than or equal to about 10 μm/about 10 μm. Thus, the L/S of the second upper circuit layer 38 may be substantially equal to the L/S of the first upper circuit layer 34, and may be greater than or equal to about five times the L/S of the circuit layer 24 of the upper conductive structure 2. In some embodiments, the second upper circuit layer 38 is formed or disposed on the first upper dielectric layer 30, and covered by the second upper dielectric layer 36. In some embodiments, the second upper circuit layer 38 is electrically connected to the first upper circuit layer 34 through the upper interconnection vias 35. That is, the upper interconnection vias 35 are disposed between the second upper circuit layer 38 and the first upper circuit layer 34 for electrically connecting the second upper circuit layer 38 and the first upper circuit layer 34. In some embodiments, the second upper circuit layer 38 and the upper interconnection vias 35 are formed integrally as a monolithic or one-piece structure. Each upper interconnection via 35 tapers downwardly along a direction from the top surface 31 towards the bottom surface 32 of the lower conductive structure 3.

In addition, in some embodiments, the second upper circuit layer 38' is disposed on and protrudes from the top surface of the second upper dielectric layer 36. In some embodiments, the second upper circuit layer 38 is electrically connected to the second upper circuit layer 38' through the upper interconnection vias 35. In some embodiments, the second upper circuit layer 38' is the topmost circuit layer of the lower conductive structure 3.

An L/S of the first lower circuit layer 34a may be greater than or equal to about 10 μm/about 10 μm. Thus, the L/S of the first lower circuit layer 34a may be greater than or equal to about five times the L/S of the circuit layer 24 of the upper conductive structure 2. In some embodiments, the first lower circuit layer 34a is formed or disposed on the bottom surface 372 of the core portion 37, and covered by the first lower dielectric layer 30a. In some embodiments, the first lower circuit layer 34a may include a first metallic layer 343a, a second metallic layer 344a and a third metallic layer 345a. The first metallic layer 343a is disposed on the bottom surface 372 of the core portion 37, and may be formed from a copper foil. The second metallic layer 344a is disposed on the first metallic layer 343a, and may be a plated copper layer. The third metallic layer 345a is disposed on the second metallic layer 344a, and may be another plated copper layer. In some embodiments, the third metallic layer 345a may be omitted.

An L/S of the second lower circuit layer 38a may be greater than or equal to about 10 μm/about 10 μm. Thus, the L/S of the second lower circuit layer 38a may be substantially equal to the L/S of the first upper circuit layer 34, and may be greater than or equal to about five times the L/S of the circuit layer 24 of the upper conductive structure 2. In some embodiments, the second lower circuit layer 38a is formed or disposed on the first lower dielectric layer 30a, and covered by the second lower dielectric layer 36a. In some embodiments, the second lower circuit layer 38a is electrically connected to the first lower circuit layer 34a through the lower interconnection vias 35a. That is, the lower interconnection vias 35a are disposed between the second lower circuit layer 38a and the first lower circuit layer 34a for electrically connecting the second lower circuit layer 38a and the first lower circuit layer 34a. In some embodiments, the second lower circuit layer 38a and the lower interconnection vias 35a are formed integrally as a monolithic or one-piece structure. The lower interconnection via 35a tapers upwardly along a direction from the bottom surface 32 towards the top surface 31 of the lower conductive structure 3.

In addition, in some embodiments, the second lower circuit layer 38a' is disposed on and protrudes from the bottom surface of the second lower dielectric layer 36a. In some embodiments, the second lower circuit layer 38a' is electrically connected to the second lower circuit layer 38a through the lower interconnection vias 35a. That is, the lower interconnection vias 35a are disposed between the second lower circuit layers 38a, 38a' for electrically connecting the second lower circuit layers 38a, 38a'. In some embodiments, the second lower circuit layer 38a' is the bottommost low-density circuit layer of the lower conductive structure 3.

In some embodiments, each interconnection via 39 electrically connects the first upper circuit layer 34 and the first lower circuit layer 34a. The base metallic layer 391 of the interconnection via 39, the second metallic layer 344 of the first upper circuit layer 34 and the second metallic layer 344a the first lower circuit layer 34a may be formed integrally and concurrently as a monolithic or one-piece structure.

The intermediate layer 12 is interposed or disposed between the upper conductive structure 2 and the lower conductive structure 3 to bond the upper conductive structure 2 and the lower conductive structure 3 together. That is, the intermediate layer 12 adheres to the bottom surface 22 of the upper conductive structure 2 and the top surface 31 of the lower conductive structure 3. In some embodiments, the intermediate layer 12 may be an adhesion layer that is cured from an adhesive material (e.g., includes a cured adhesive material such as an adhesive polymeric material). Thus, the bottommost circuit layer 24 of the upper conductive structure 2 and the topmost circuit layer (e.g., the second upper circuit layer 38') of the lower conductive structure 3 are embedded in the intermediate layer 12. In some embodiments, a bonding force between two adjacent dielectric layers 20, 26, 27 of the upper conductive structure 2 is greater than a bonding force between the third dielectric layer 27 of the upper conductive structure 2 and the intermediate layer 12. A surface roughness of a boundary between two adjacent dielectric layers 20, 26, 27 of the upper conductive structure 2 is greater than a surface roughness of a boundary between a dielectric layer (e.g., the third dielectric layer 27) of the upper conductive structure 2 and the intermediate layer 12, such as about 1.1 times or greater, about 1.3 times or greater, or about 1.5 times or greater in terms of root mean squared surface roughness.

In some embodiments, a material of the intermediate layer 12 is transparent, and can be seen through by human eyes or machine. In addition, the material of the intermediate layer 12 may be different from the material of the dielectric layers 30, 36, 30a, 36a of the lower conductive structure 3 and the material of the dielectric layers 20, 26, 27 of the upper conductive structure 2. For example, the material of the intermediate layer 12 may be ABF, or ABF-like dielectric film.

The intermediate layer 12 defines at least one through hole 123. In some embodiments, the through hole 123 of the intermediate layer 12 extends through the intermediate layer 12 and terminates at or on a topmost circuit layer (e.g., the second upper circuit layer 38') of the lower conductive structure 3. In some embodiments, the sidewall of the through hole 123 of the intermediate layer 12 may be curved since it may be formed by plasma. The through hole 123 of the intermediate layer 12 may expose a portion of the topmost circuit layer (e.g., a top surface of the second upper circuit layer 38') of the lower conductive structure 3.

As shown in FIG. 1, the through hole 123 of the intermediate layer 12 may be aligned with and in communication with the accommodating hole 16 of the upper conductive structure 2 for accommodating the conductive through via 14. Thus, a bottom portion 141 of the conductive through via 14 may be disposed in the through hole 123 of the intermediate layer 12. The conductive through via 14 may further extend through the through hole 123 of the intermediate layer 12, and is electrically connected to the topmost circuit layer (e.g., the top surface of the second upper circuit layer 38') of the lower conductive structure 3. The conductive through via 14 extends from the top surface 21 of the upper conductive structure 2 to the bottom surface of the intermediate layer 12 to terminate at or on a portion of the topmost circuit layer (e.g., the top surface of the second upper circuit layer 38') of the lower conductive structure 3. Thus, a length of the conductive through via 14 is greater than a thickness of the upper conductive structure 2. In some embodiments, the upper conductive structure 2 is electrically connected to the lower conductive structure 3 only through the conductive through via 14.

As shown in the embodiment illustrated in FIG. 1 and FIG. 2, the wiring structure 1 is a combination of the upper conductive structure 2 and the lower conductive structure 3, in which the circuit layers 24 of the upper conductive structure 2 has fine pitch, high yield and low thickness; and the circuit layers 34, 38, 38', 34a, 38a, 38a' of the lower conductive structure 3 have low manufacturing cost. Thus, the wiring structure 1 has an advantageous compromise of yield and manufacturing cost, and the wiring structure 1 has a relatively low thickness. The manufacturing yield for one layer of the circuit layers 24 of the upper conductive structure 2 may be 99%, and the manufacturing yield for one layer of the circuit layers 34, 38, 38', 34a, 38a, 38a' of the lower conductive structure 3 may be 90%. Thus, the yield of the wiring structure 1 may be improved. In addition, the warpage of the upper conductive structure 2 and the warpage of the lower conductive structure 3 are separated and will not influence each other. Thus, the warpage of the lower conductive structure 3 will not be accumulated onto the warpage of the upper conductive structure 2. Thus, the yield of the wiring structure 1 may be further improved.

Figure 4:
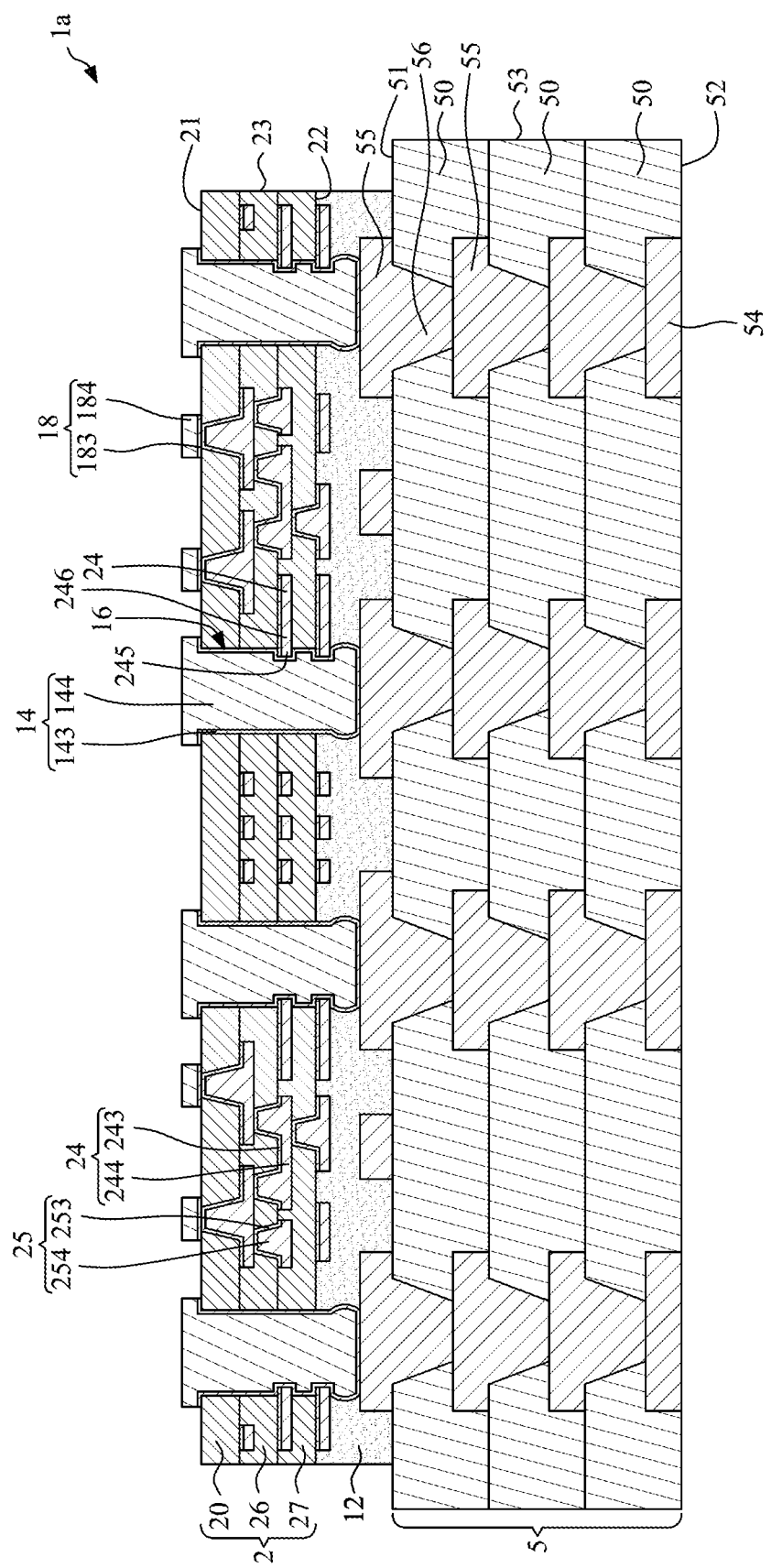
FIG. 4 illustrates a cross-sectional view of a wiring structure according to some embodiments of the present disclosure.

FIG. 4 illustrates a cross-sectional view of a wiring structure 1a according to some embodiments of the present disclosure. The wiring structure 1a is similar to the wiring structure 1 shown in FIG. 1, except for a structure of the lower conductive structure 5. As shown in FIG. 4, the lower conductive structure 5 may be a coreless substrate, and may include at least one dielectric layer (including, for example, three dielectric layers 50), at least one circuit layer (including, for example, three upper circuit layers 55 and one lower circuit layer 54 formed of a metal, a metal alloy, or other conductive material) in contact with the dielectric layer(s) 50 and at least one inner conductive via 56 (including, for example, a plurality of inner conductive vias 56). As shown in FIG. 4, the lower conductive structure 5 has a top surface 51, a bottom surface 52 opposite to the top surface 51, and a lateral surface 53 extending between the top surface 51 and the bottom surface 52. The lateral surface 23 of the upper conductive structure 2 may be displaced or recessed from the lateral surface 53 of the lower conductive structure 5. In some embodiments, the lateral surface 23 of the upper conductive structure 2 may be substantially coplanar with the lateral surface 53 of the lower conductive structure 5.

The lower circuit layer 54 is embedded in the bottommost dielectric layer 50, and exposed from the bottom surface of the bottommost dielectric layer 50. The upper circuit layers 55 are disposed on the dielectric layers 50. Some of the inner conductive vias 56 are disposed between two adjacent upper circuit layers 55 for electrically connecting the two upper circuit layers 55. The inner conductive vias 56 and the upper circuit layer 55 may be formed integrally and concurrently. Some of the inner conductive vias 56 are disposed between the upper circuit layer 55 and the lower circuit layer 54 for electrically connecting the upper circuit layer 55 and the lower circuit layer 54. Each inner conductive via 56 tapers downwardly along a direction from the top surface 51 towards the bottom surface 52 of the lower conductive structure 5. Thus, a tapering direction of the inner conductive via 56 of the lower conductive structure 5 is different from the tapering direction of the inner conductive via 25 of the upper conductive structure 2.

A thickness of each of the dielectric layers 20, 26, 27 of the upper conductive structure 2 is less than or equal to about 40%, less than or equal to about 35%, or less than or equal to about 30% of a thickness of each of the dielectric layers 50 of the lower conductive structure 5. In addition, a material of the dielectric layers 50 of the lower conductive structure 5 may be different from the material of the dielectric layers 20, 26, 27 of the upper conductive structure 2. For example, the material of the dielectric layers 50 of the lower conductive structure 5 may be polypropylene (PP) or ajinomoto build-up film (ABF).

An L/S of the upper circuit layer 55 and the lower circuit layer 54 may be greater than or equal to about 10 μm/about 10 μm. Thus, the L/S of the upper circuit layer 55 and the lower circuit layer 54 may be greater than or equal to about five times the L/S of the circuit layer 24 of the upper conductive structure 2. In addition, in some embodiments, the topmost upper circuit layer 55 is disposed on and protrudes from the top surface of the topmost dielectric layer 50 (i.e., the top surface 51 of the lower conductive structure 5).

The intermediate layer 12 is interposed or disposed between the upper conductive structure 2 and the lower conductive structure 5 to bond the upper conductive structure 2 and the lower conductive structure 5 together. In addition, the material of intermediate layer 12 may be different from the material of the dielectric layers 50 the lower conductive structure 5. The conductive through via 14 may extend through the intermediate layer 12, and is electrically connected to the topmost upper circuit layer 55 of the lower conductive structure 5.

Figure 5:
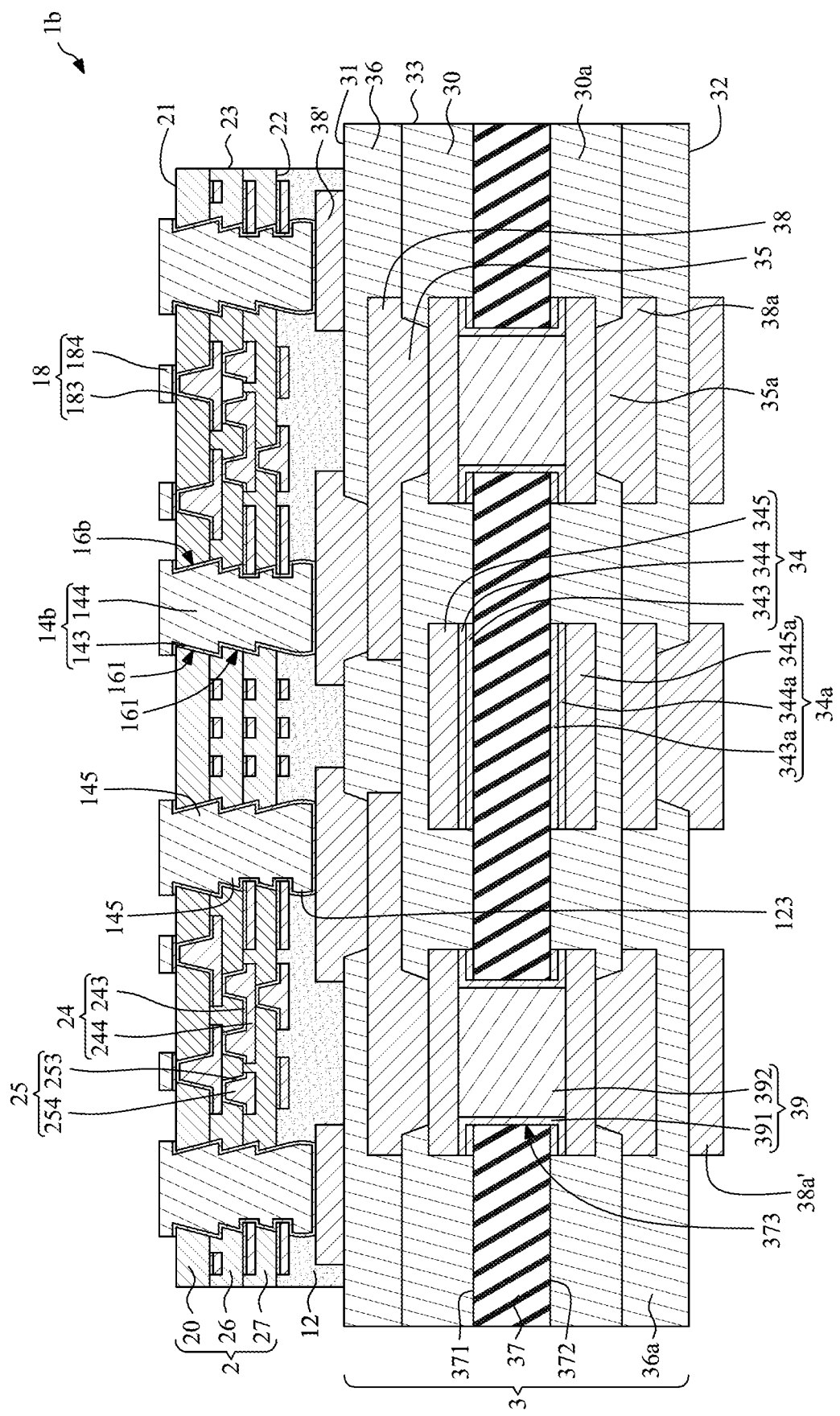
FIG. 5 illustrates a cross-sectional view of a wiring structure according to some embodiments of the present disclosure.

FIG. 5 illustrates a cross-sectional view of a wiring structure 1b according to some embodiments of the present disclosure. The wiring structure 1b is similar to the wiring structure 1 shown in FIG. 1, except for the shapes of the accommodating hole 16b and the conductive through via 14b. As shown in FIG. 5, the sidewall of the accommodating hole 16b is not continuous or smooth. For example, the accommodating hole 16b may include a plurality of tapered portions 161 arranged in a row. Accordingly, the peripheral side surface of the conductive through via 14b may be not a continuous or smooth surface. The conductive through via 14b may include a plurality of truncated cone portions 145. Each of the truncated cone portions 145 may be in a trapezoid shape from a cross-sectional view.

Figure 6:
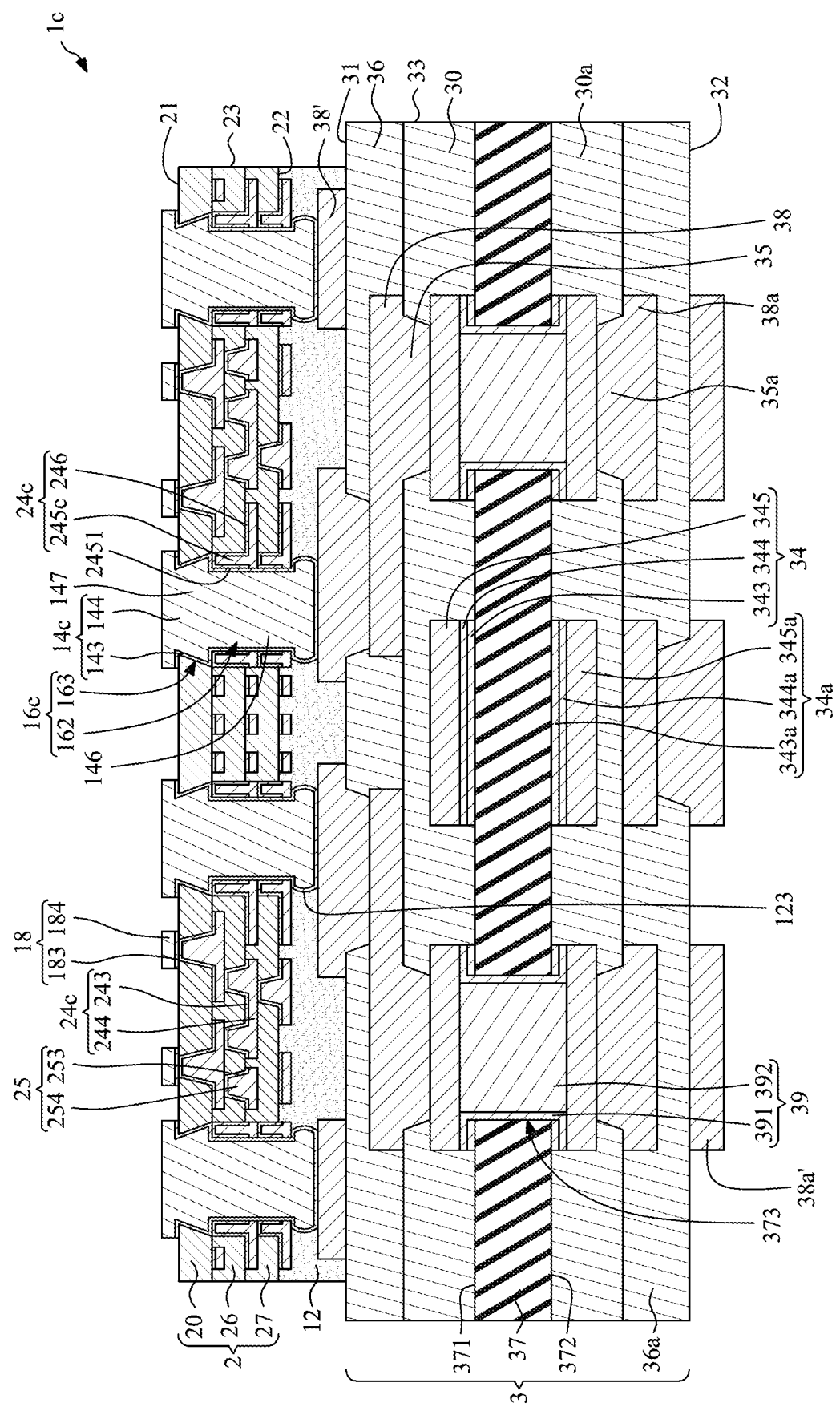
FIG. 6 illustrates a cross-sectional view of a wiring structure according to some embodiments of the present disclosure.
Figure 7:
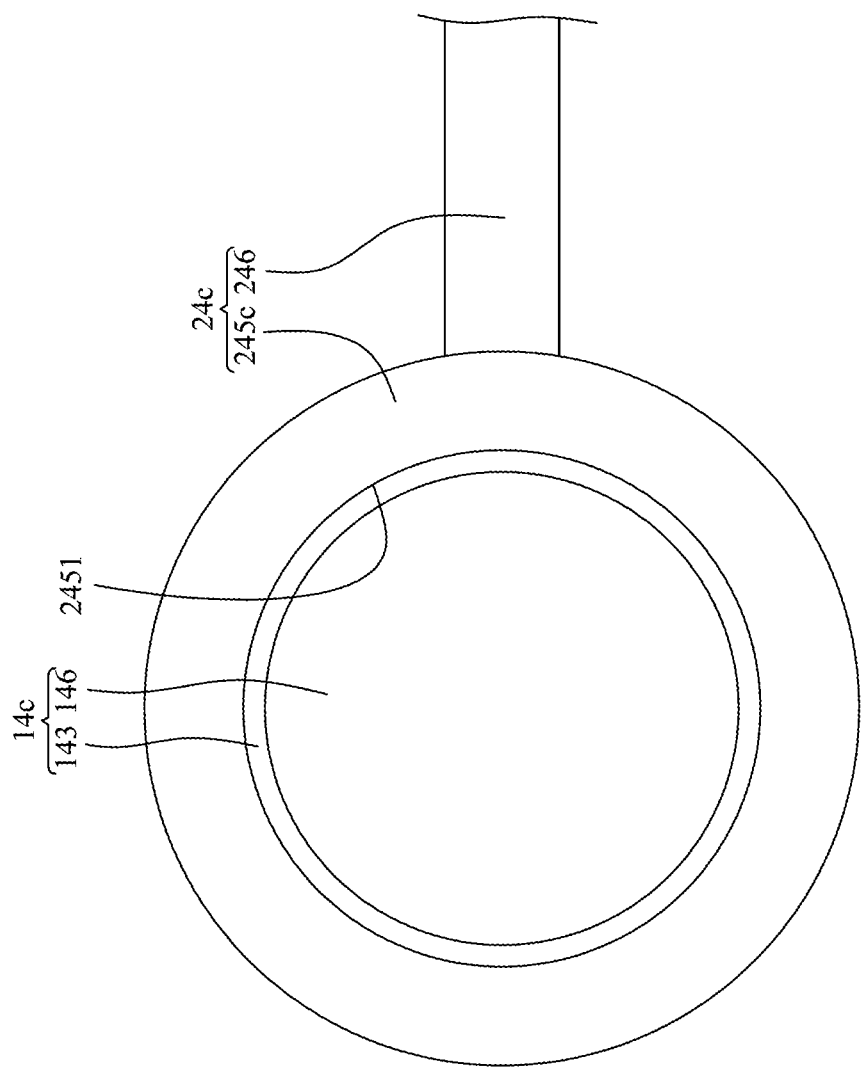
FIG. 7 illustrates a top view of a circuit layer and a lower portion of a conductive through via of FIG. 6.

FIG. 6 illustrates a cross-sectional view of a wiring structure 1c according to some embodiments of the present disclosure. FIG. 7 illustrates a top view of a circuit layer 24c and a lower portion 146 of the conductive through via 14c of FIG. 6. The wiring structure 1c is similar to the wiring structure 1 shown in FIG. 1, except for the structures of the first portion 245c of the circuit layer 24c, the accommodating hole 16c and the conductive through via 14c. The first portion 245c is a dam portion extending vertically and in contact with the second dielectric layer 26 and the third dielectric layer 27. As shown in FIG. 7, the first portion 245c is in a substantially closed ring shape and surrounds the conductive through via 14c. As shown in FIG. 6, the first portion 245c and the second portion 246 of the circuit layer 24c are formed concurrently and integrally. A surface roughness of an inner surface 2451 of the first portion 245c is greater than the surface roughness of the second portion 246 of the circuit layer 24c. In addition, a top end of the first portion 245c in the third dielectric layer 27 is in contact with an adjacent circuit layer 24c (i.e., the circuit layer 24c disposed on the second electric layer 26).

The accommodating hole 16c includes a lower portion 162 and an upper portion 163. The lower portion 162 is defined by the first portions 245c, and has a substantially consistent width. The upper portion 163 is defined by the first dielectric layer 20 rather than a dam portion, and may taper upwardly. The conductive through via 14c is disposed in the accommodating hole 16c, and includes a lower portion 146 and an upper portion 147. The lower portion 146 of the conductive through via 14c is disposed in the lower portion 162 of the accommodating hole 16c, and has a substantially consistent width. The lower portion 146 of the conductive through via 14c contacts the inner surface 2451 of the first portion 245c. The upper portion 147 of the conductive through via 14c is disposed in the upper portion 163 of the accommodating hole 16c, and may taper upwardly.

Figure 8:
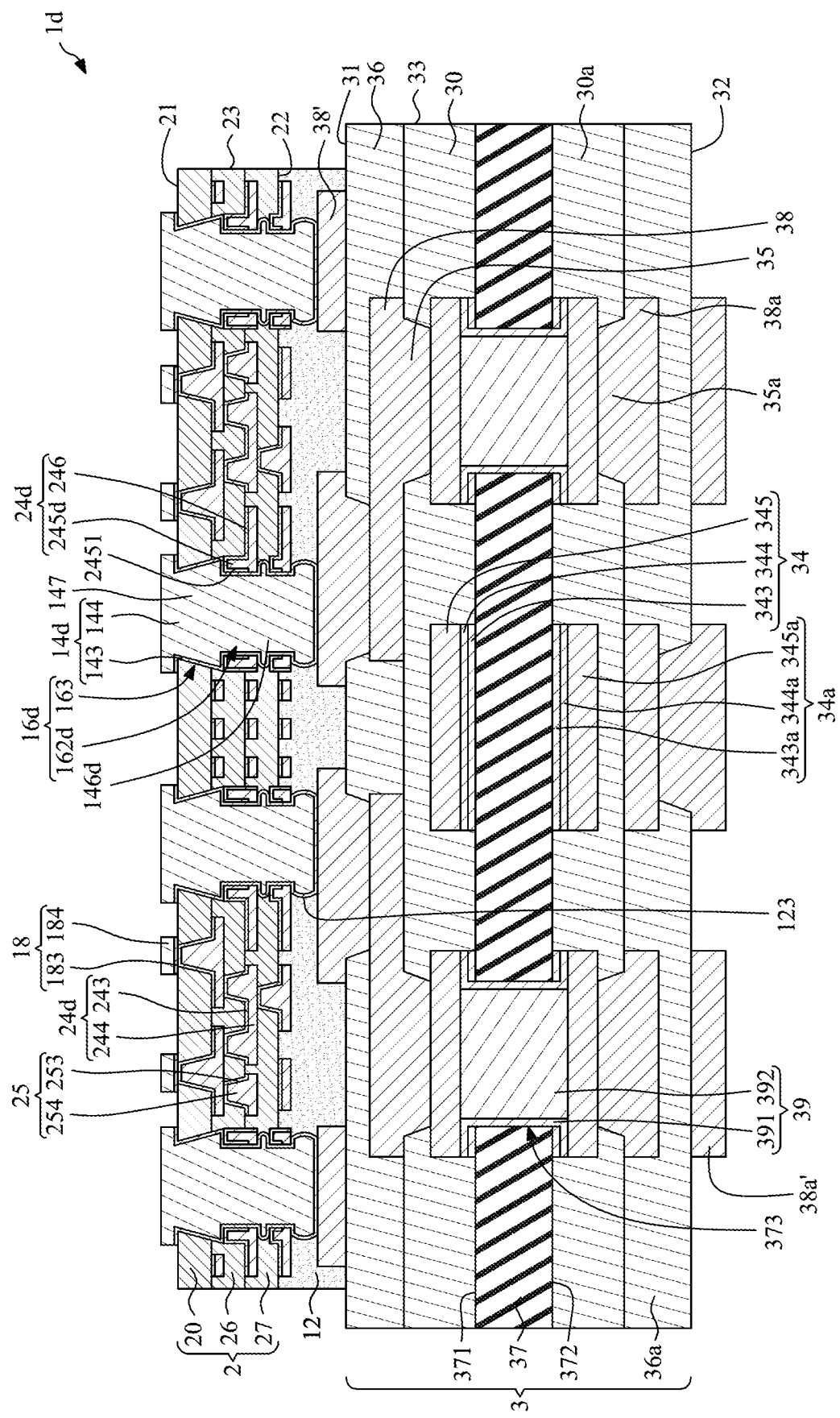
FIG. 8 illustrates a cross-sectional view of a wiring structure according to some embodiments of the present disclosure.

FIG. 8 illustrates a cross-sectional view of a wiring structure 1d according to some embodiments of the present disclosure. The wiring structure 1d is similar to the wiring structure 1c shown in FIG. 6 and FIG. 7, except for the structures of the first portion 245d of the circuit layer 24d, the accommodating hole 16d and the conductive through via 14d. As shown in FIG. 8, a top end of the first portion 245d in the third dielectric layer 27 is spaced apart form an adjacent circuit layer 24d (i.e., the circuit layer 24d disposed on the second electric layer 26). Thus, the third dielectric layer 27 may define a recess portion 273 in the gap between the top end of the first portion 245d in the third dielectric layer 27 and the adjacent circuit layer 24d disposed on the second electric layer 26.

The accommodating hole 16c includes a lower portion 162d and an upper portion 163. The lower portion 162d is defined by the first portions 245c, and has a substantially consistent width. The upper portion 163 is defined by the first dielectric layer 20 rather than a dam portion, and may taper upwardly. The lower portion 162d may further include the recess portion 273. The conductive through via 14d is disposed in the accommodating hole 16d, and includes a lower portion 146d and an upper portion 147. The lower portion 146d of the conductive through via 14d is disposed in the lower portion 162d of the accommodating hole 16d, and has a substantially consistent width. The lower portion 146d of the conductive through via 14d contacts the inner surface 2451 of the first portion 245d, and includes an protrusion portion 148 extending into the recess portion 273 in the gap between the top end of the first portion 245d in the third dielectric layer 27 and the adjacent circuit layer 24d disposed on the second electric layer 26. The upper portion 147 of the conductive through via 14d is disposed in the upper portion 163 of the accommodating hole 16d, and may taper upwardly.

Figure 9:
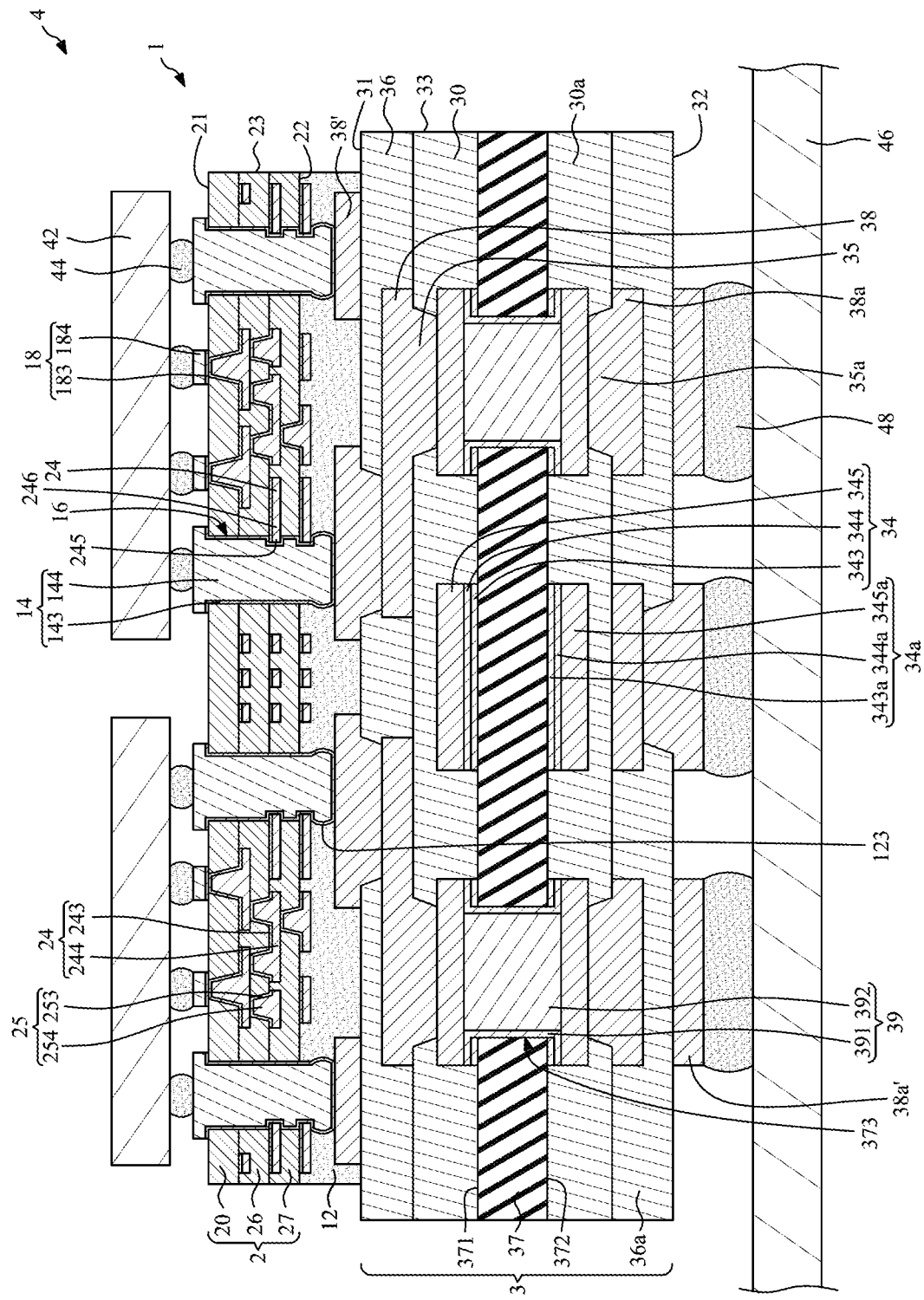
FIG. 9 illustrates a cross-sectional view of a bonding of a package structure and a substrate according to some embodiments of the present disclosure.

FIG. 9 illustrates a cross-sectional view of a bonding of a package structure 4 and a substrate 46 according to some embodiments. The package structure 4 includes a wiring structure 1, at least one semiconductor chip 42, a plurality of first connecting elements 44 and a plurality of second connecting elements 48. The wiring structure 1 of FIG. 8 is similar to the wiring structure 1 shown in FIG. 1. The semiconductor chip 42 is electrically connected and bonded to the outer circuit layer 18 through the first connecting elements 44 (e.g., solder bumps or other conductive bumps). The second lower circuit layer 38a' of the lower conductive structure 3 is electrically connected and bonded to the substrate 46 (e.g., a mother board such as a printed circuit board (PCB)) through the second connecting elements 48 (e.g., solder bumps or other conductive bumps).

FIG. 10 through FIG. 29 illustrate a method for manufacturing a wiring structure according to some embodiments of the present disclosure. In some embodiments, the method is for manufacturing the wiring structure 1 shown in FIG. 1.

Figure 10:
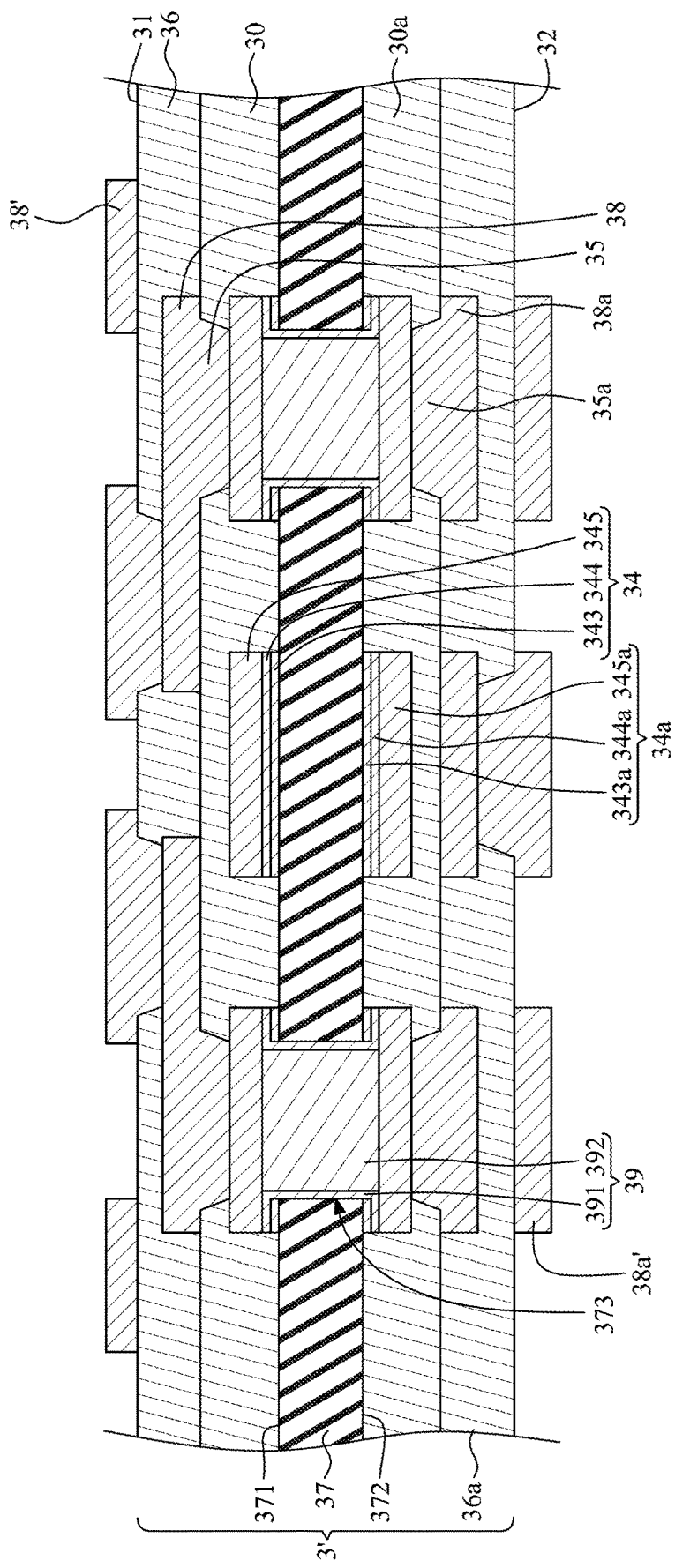
FIG. 10 illustrates one or more stages of an example of a method for manufacturing a wiring structure according to some embodiments of the present disclosure.

Referring to FIG. 10, a lower conductive structure 3' is provided. The lower conductive structure 3' is similar to the lower conductive structure 3 of FIG. 1, and includes the dielectric layers 30, 36, 30a, 36a, the circuit layers 34, 38, 38', 34a, 38a, 38a', the core portion 37, the upper interconnection vias 35 and the lower interconnection vias 35a. An electrical property (such as open circuit/short circuit) of the lower conductive structure 3' may be tested.

Figure 11:
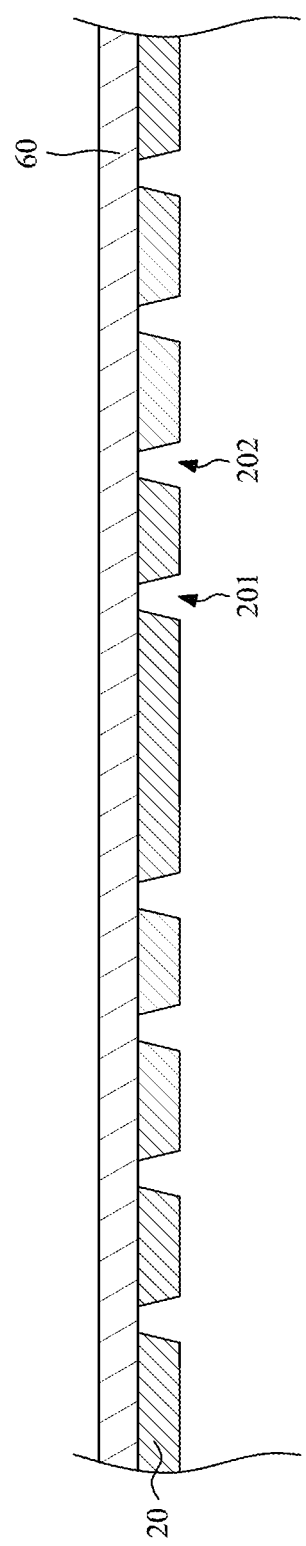
FIG. 11 illustrates one or more stages of an example of a method for manufacturing a wiring structure according to some embodiments of the present disclosure.

Referring to FIG. 11 through FIG. 22, an upper conductive structure 2 is provided. The upper conductive structure 2 is manufactured as follows. Referring to FIG. 11, a carrier 60 is provided. The carrier 60 may be a glass carrier, and may be in a wafer type, a panel type or a strip type. Then, a patterned first dielectric layer 20 is formed on the carrier 60. The patterned first dielectric layer 20 defines at least one first opening 201 and at least one second opening 202 extending through the first dielectric layer 20. A width of the first opening 201 may be equal to a width of the second opening 202.

Figure 12:
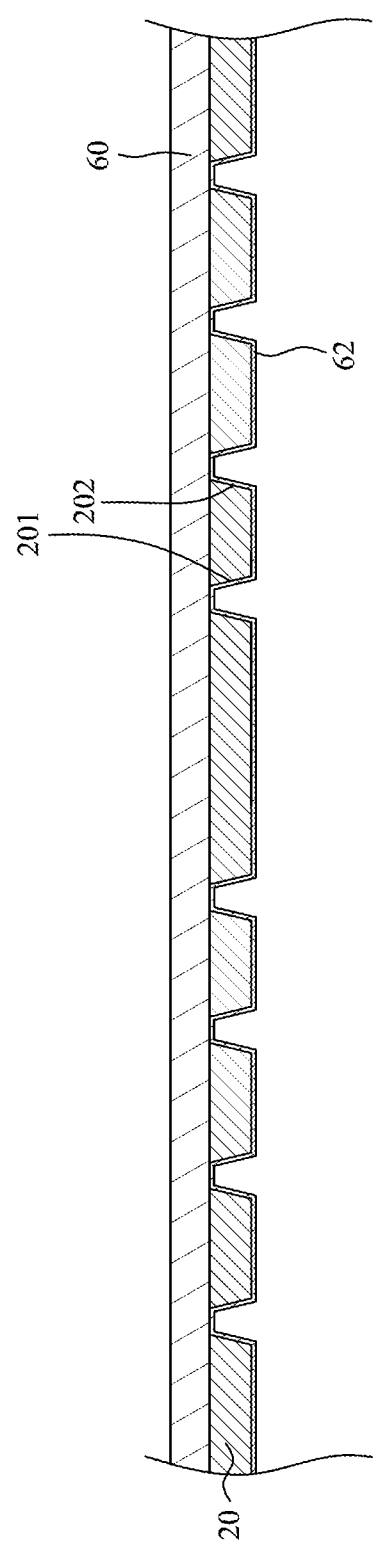
FIG. 12 illustrates one or more stages of an example of a method for manufacturing a wiring structure according to some embodiments of the present disclosure.

Referring to FIG. 12, a seed layer 62 is formed or disposed on the first dielectric layer 20, the first opening 201 and the second opening 202 by a physical vapor deposition (PVD) technique or other suitable techniques.

Figure 13:
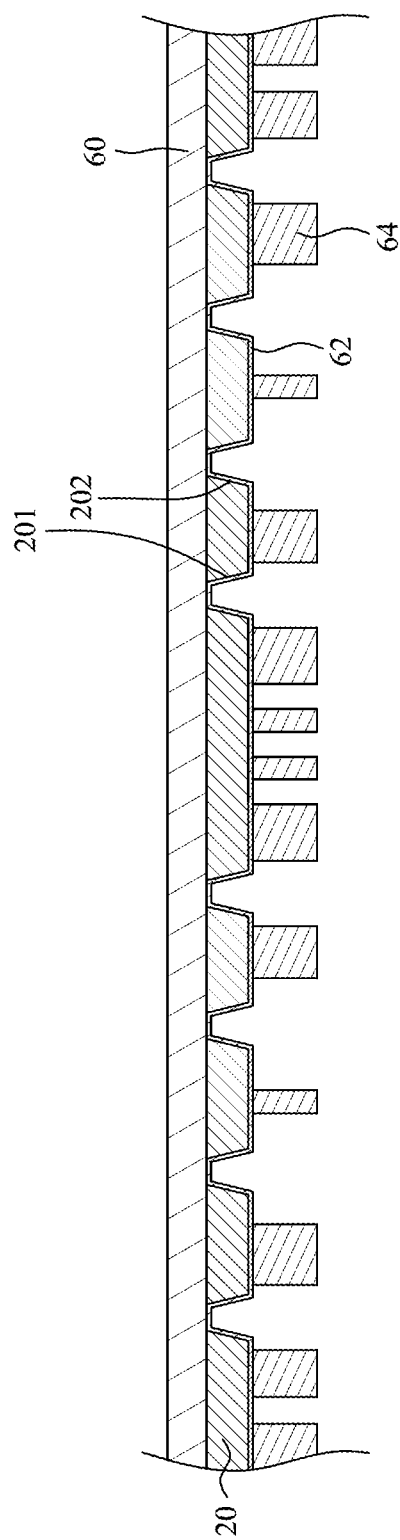
FIG. 13 illustrates one or more stages of an example of a method for manufacturing a wiring structure according to some embodiments of the present disclosure.

Referring to FIG. 13, a first photoresist layer 64 is formed or disposed on the seed layer 62. Then, the first photoresist layer 64 is patterned to form a plurality of openings to expose portions of the seed layer 62 by an exposure and development technique or other suitable techniques.

Figure 14:
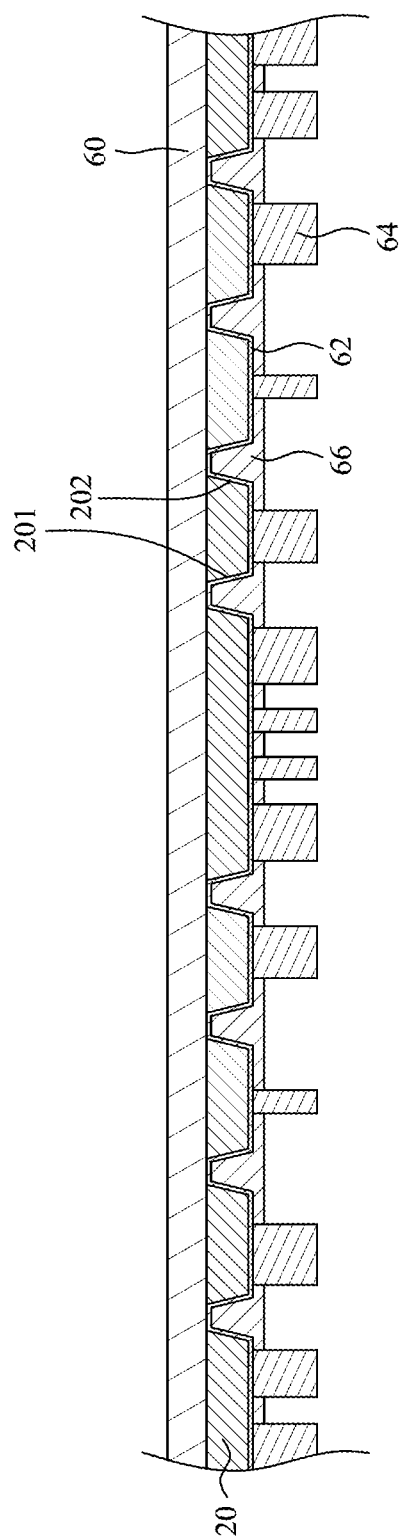
FIG. 14 illustrates one or more stages of an example of a method for manufacturing a wiring structure according to some embodiments of the present disclosure.

Referring to FIG. 14, a conductive material 66 (e.g., a metallic material) is disposed in the openings of the first photoresist layer 64 and on the seed layer 62 by a plating technique or other suitable techniques.

Figure 15:
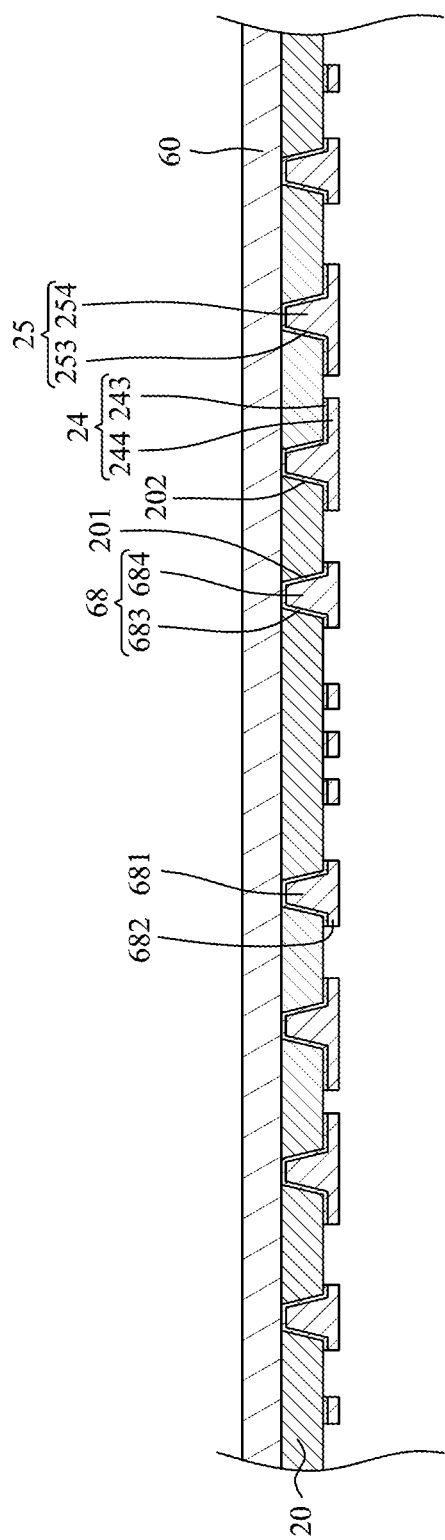
FIG. 15 illustrates one or more stages of an example of a method for manufacturing a wiring structure according to some embodiments of the present disclosure.

Referring to FIG. 15, the first photoresist layer 64 is removed by a stripping technique or other suitable techniques. Then, portions of the seed layer 62 that are not covered by the conductive material 66 are removed by an etching technique or other suitable techniques. Meanwhile, a circuit layer 24, at least one inner conductive via 25 and at least one stacking portion 68 are formed. The circuit layer 24 is disposed on a bottom surface of the first dielectric layer 20, and include a seed layer 243 formed from the seed layer 62 and a conductive material 244 disposed on the seed layer 243 and formed from the conductive material 66. The inner conductive via 25 is disposed in the second opening 202 of the first dielectric layer 20, and includes a seed layer 253 formed from the seed layer 62 and a conductive material 254 disposed on the seed layer 253 and formed from the conductive material 66. The stacking portion 68 is disposed in the first opening 201 of the first dielectric layer 20, and includes a seed layer 683 formed from the seed layer 62 and a conductive material 684 disposed on the seed layer 683 and formed from the conductive material 66. The stacking portion 68 may include a via portion 681 extending through the first dielectric layer 20 and a pad portion 682 on the via portion 681. A shape and a size of the via portion 681 of the stacking portion 68 may be same as a shape and a size of the inner conductive via 25. A shape and a size of the pad portion 682 of the stacking portion 68 may be same as a shape and a size of a pad of the circuit layer 24.

Figure 16:
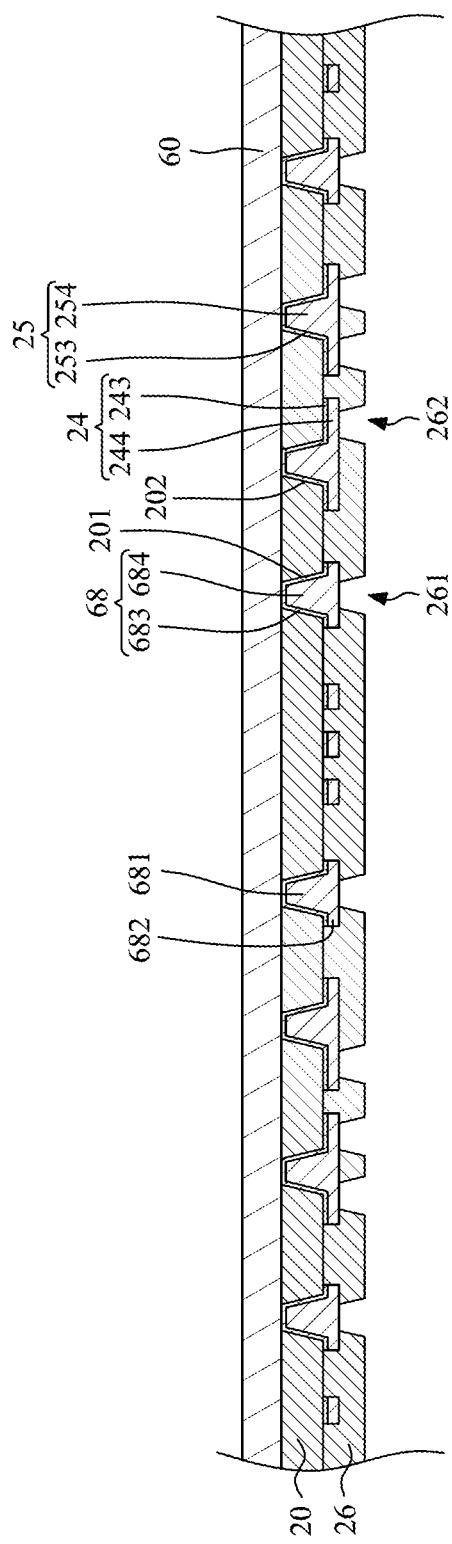
FIG. 16 illustrates one or more stages of an example of a method for manufacturing a wiring structure according to some embodiments of the present disclosure.

Referring to FIG. 16, a patterned second dielectric layer 26 is formed on the first dielectric layer 20 to cover the circuit layer 24 and the stacking portion(s) 68. The patterned second dielectric layer 26 defines at least one first opening 261 and at least one second opening 262 extending through the second dielectric layer 26. The first opening 261 is disposed on the stacking portion 68 so as to expose the pad portion 682 of the stacking portion 68. The second opening 262 is disposed on the circuit layer 24 so as to expose a portion of the circuit layer 24. It is noted that the stacking portion 68 is separated from the circuit layer 24. That is, the stacking portion 68 does not contact or connect the circuit layer 24. Thus, the second dielectric layer 26 covers the gap between the stacking portion 68 and the circuit layer 24.

Figure 17:
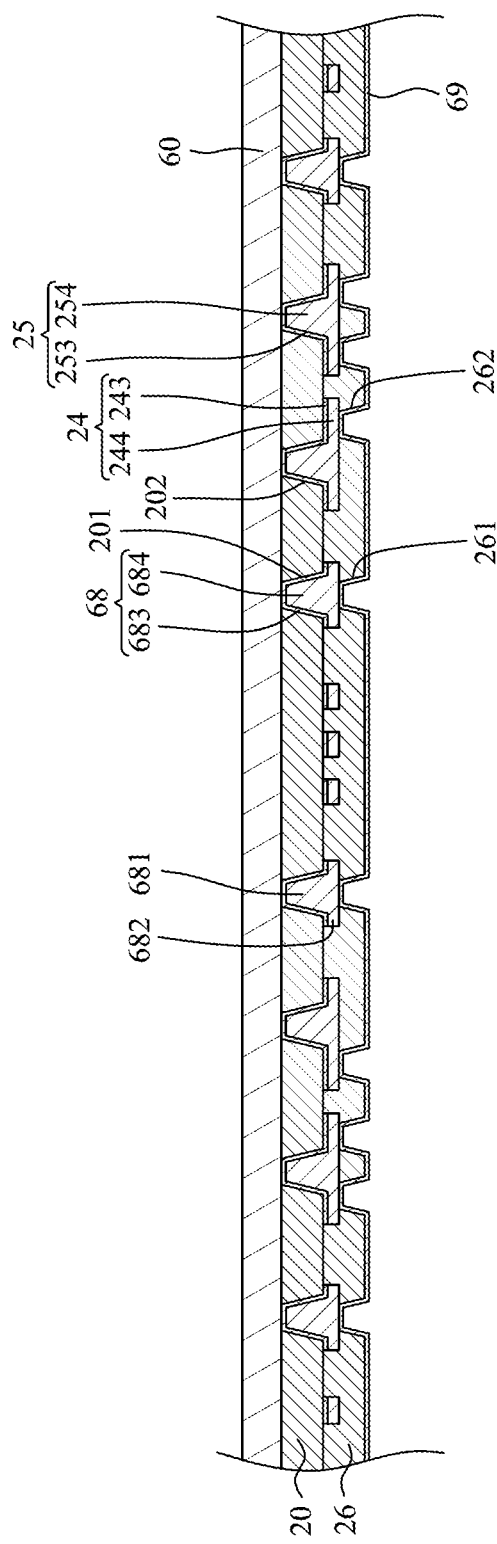
FIG. 17 illustrates one or more stages of an example of a method for manufacturing a wiring structure according to some embodiments of the present disclosure.

Referring to FIG. 17, a seed layer 69 is formed or disposed on the second dielectric layer 26, the first opening 261 and the second opening 262 by a physical vapor deposition (PVD) technique or other suitable techniques.

Figure 18:
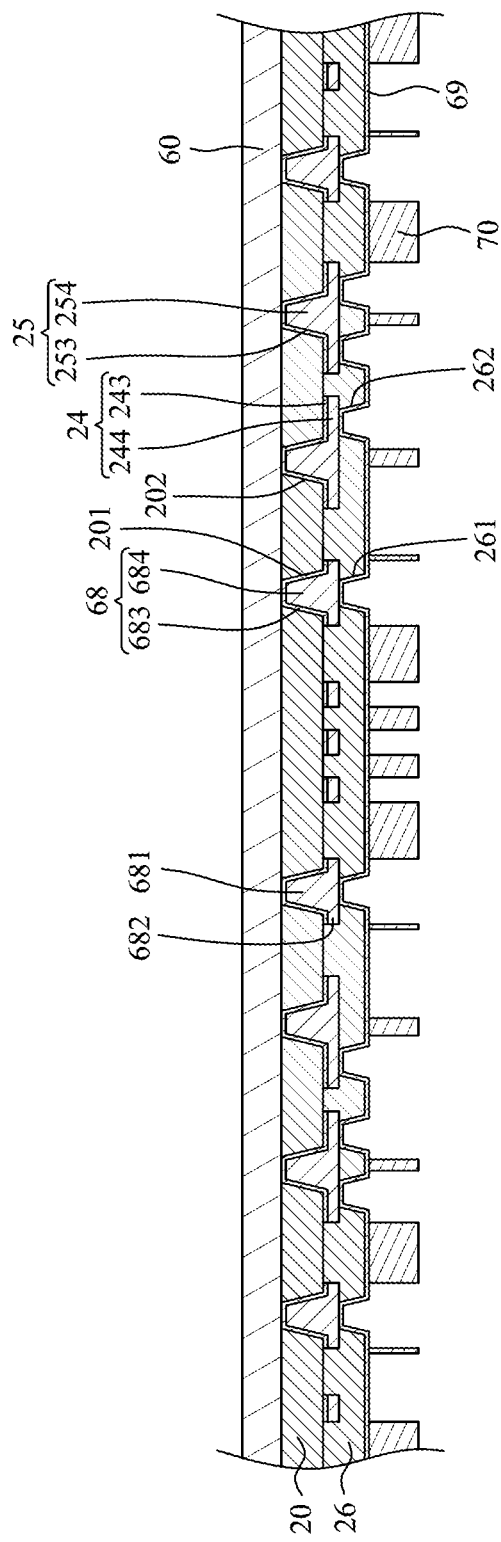
FIG. 18 illustrates one or more stages of an example of a method for manufacturing a wiring structure according to some embodiments of the present disclosure.

Referring to FIG. 18, a second photoresist layer 70 is formed or disposed on the seed layer 69. Then, the second photoresist layer 70 is patterned to form a plurality of openings to expose portions of the seed layer 69 by an exposure and development technique or other suitable techniques.

Figure 19:
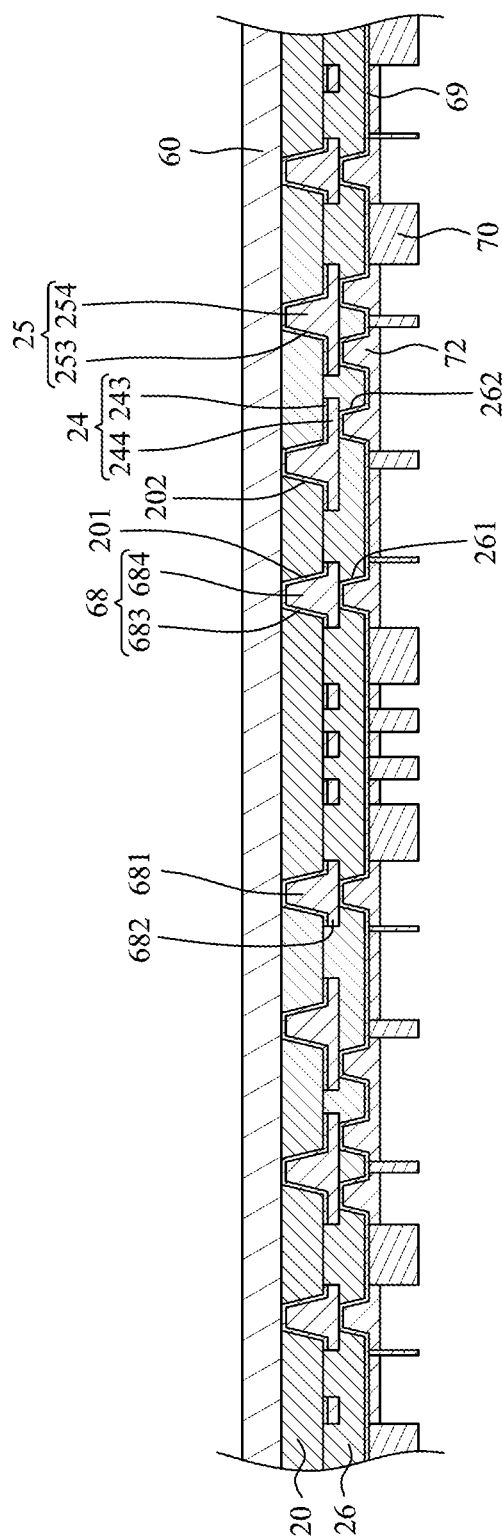
FIG. 19 illustrates one or more stages of an example of a method for manufacturing a wiring structure according to some embodiments of the present disclosure.

Referring to FIG. 19, a conductive material 72 (e.g., a metallic material) is disposed in the openings of the second photoresist layer 70 and on the seed layer 69 by a plating technique or other suitable techniques.

Figure 20:
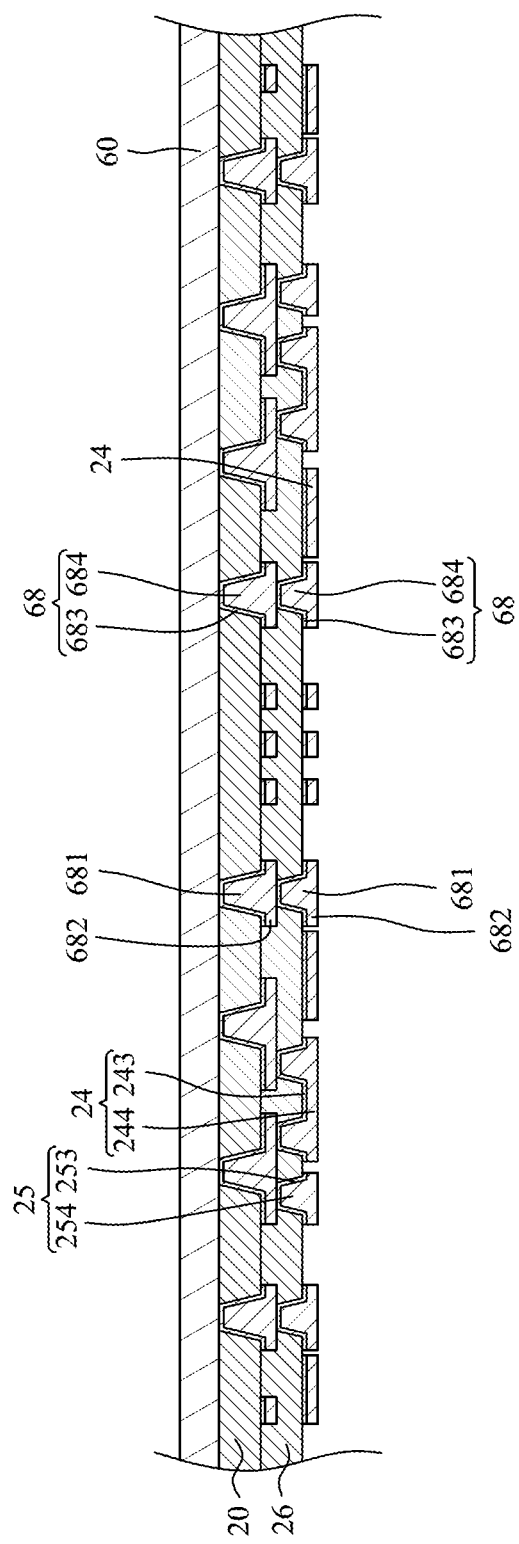
FIG. 20 illustrates one or more stages of an example of a method for manufacturing a wiring structure according to some embodiments of the present disclosure.

Referring to FIG. 20, the second photoresist layer 70 is removed by a stripping technique or other suitable techniques. Then, portions of the seed layer 69 that are not covered by the conductive material 72 are removed by an etching technique or other suitable techniques. Meanwhile, a circuit layer 24, at least one inner conductive via 25 and at least one stacking portion 68 are formed. The circuit layer 24 is disposed on a bottom surface of the second dielectric layer 26, and include a seed layer 243 formed from the seed layer 69 and a conductive material 244 disposed on the seed layer 243 and formed from the conductive material 72. The inner conductive via 25 is disposed in the second opening 262 of the second dielectric layer 26, and includes a seed layer 253 formed from the seed layer 69 and a conductive material 254 disposed on the seed layer 253 and formed from the conductive material 72. The stacking portion 68 is disposed in the first opening 261 of the second dielectric layer 26, and includes a seed layer 683 formed from the seed layer 68 and a conductive material 684 disposed on the seed layer 683 and formed from the conductive material 72. The stacking portion 68 may include a via portion 681 extending through the second dielectric layer 26 and a pad portion 682 on the via portion 681. A shape and a size of the via portion 681 of the stacking portion 68 may be same as a shape and a size of the inner conductive via 25. A shape and a size of the pad portion 682 of the stacking portion 68 may be same as a shape and a size of a pad of the circuit layer 24.

Figure 21:
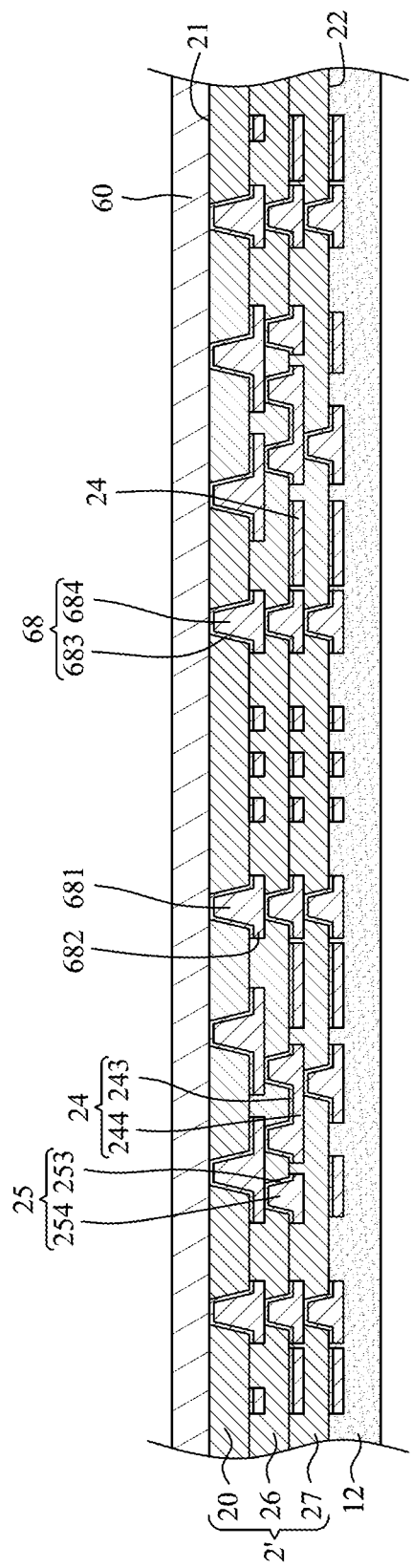
FIG. 21 illustrates one or more stages of an example of a method for manufacturing a wiring structure according to some embodiments of the present disclosure.

Referring to FIG. 21, the stages illustrated in FIG. 16 to FIG. 20 are repeated to form a patterned third dielectric layer 27, the circuit layer 24 on the third dielectric layer 27, the inner conductive via 25 extending through the third dielectric layer 27, and the stacking portion 68 embedded in the third dielectric layer 27. In some embodiments, the stacking portions 68 in different dielectric layers may be arranged substantially in a row, and may be aligned with one another. In addition, the stacking portions 68 may connect or contact one another or may be stacked with one another.

Meanwhile, an upper conductive structure 2' is formed on the carrier 60. The upper conductive structure 2' may be tested.

Figure 22:
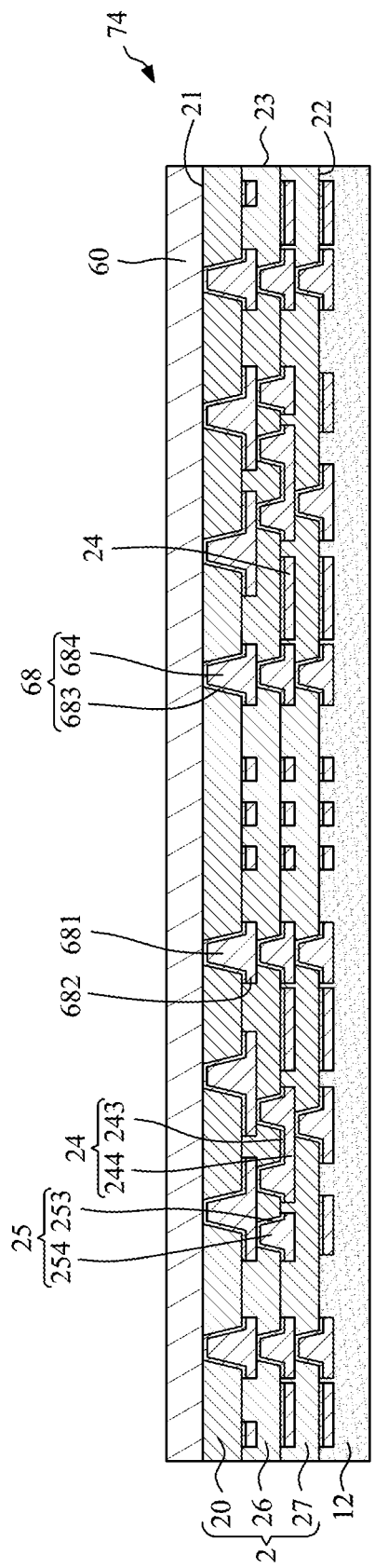
FIG. 22 illustrates one or more stages of an example of a method for manufacturing a wiring structure according to some embodiments of the present disclosure.

Referring to FIG. 22, the upper conductive structure 2', the carrier 60 and the adhesive layer 12 are cut to form a plurality of unit structures 74. The unit structure 74 includes an upper conductive structure 2 and a portion of the carrier 60. The upper conductive structure 2 of FIG. 22 may be the upper conductive structure 2 of FIG. 1. Then, an adhesive layer 12 is formed or applied on the bottom surface 22 of the upper conductive structure 2 to cover the bottommost circuit layer 24.

Figure 23:
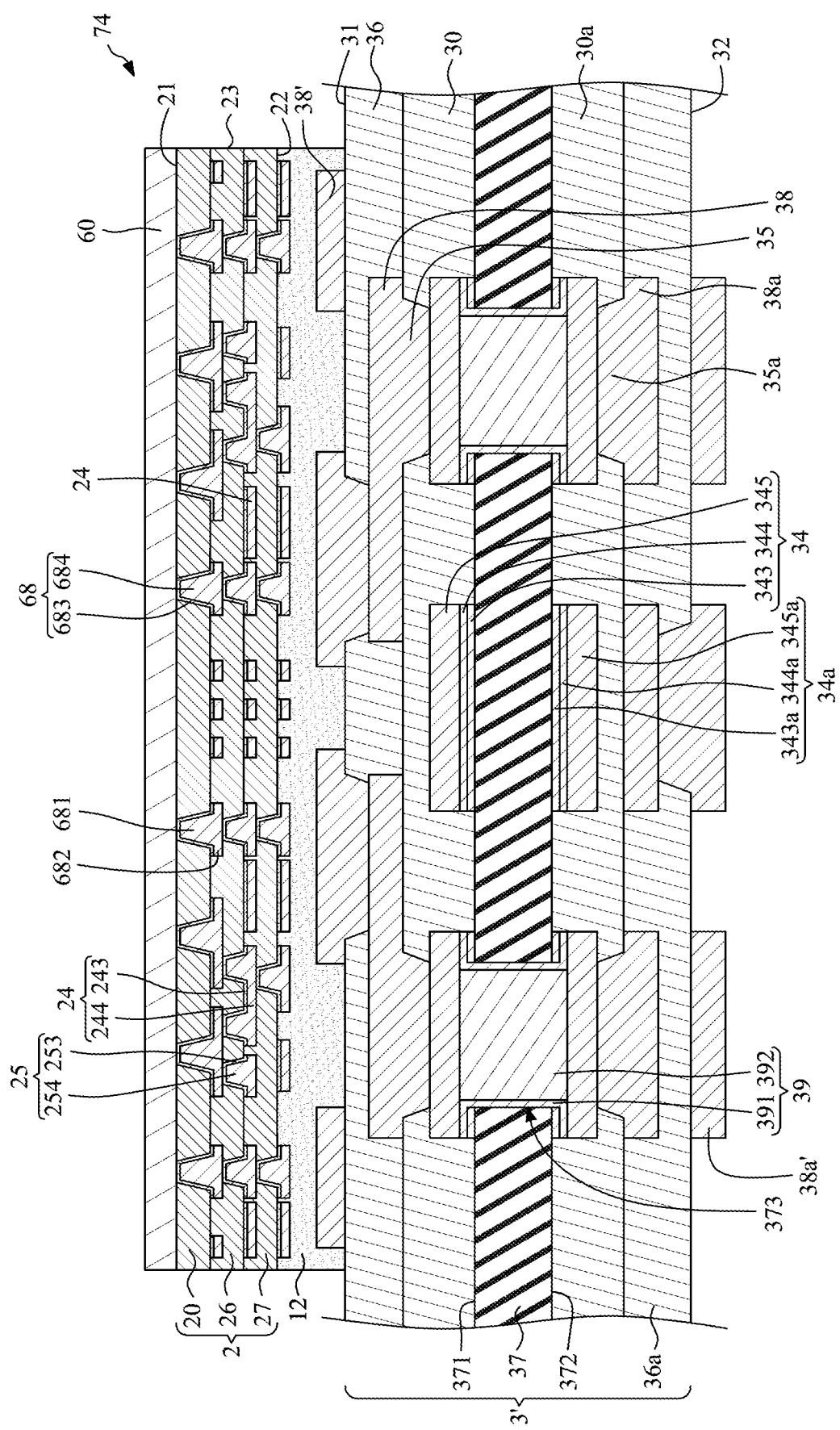
FIG. 23 illustrates one or more stages of an example of a method for manufacturing a wiring structure according to some embodiments of the present disclosure.

Referring to FIG. 23, the unit structure 74 is attached to the lower conductive structure 3' of FIG. 10. The upper conductive structure 2 faces the lower conductive structure 3'. Thus, the upper conductive structure 2 and the carrier 60 are attached to the lower conductive structure 3' through the adhesive layer 12. Then, the adhesive layer 12 is cured to form an intermediate layer 12.

Figure 24:
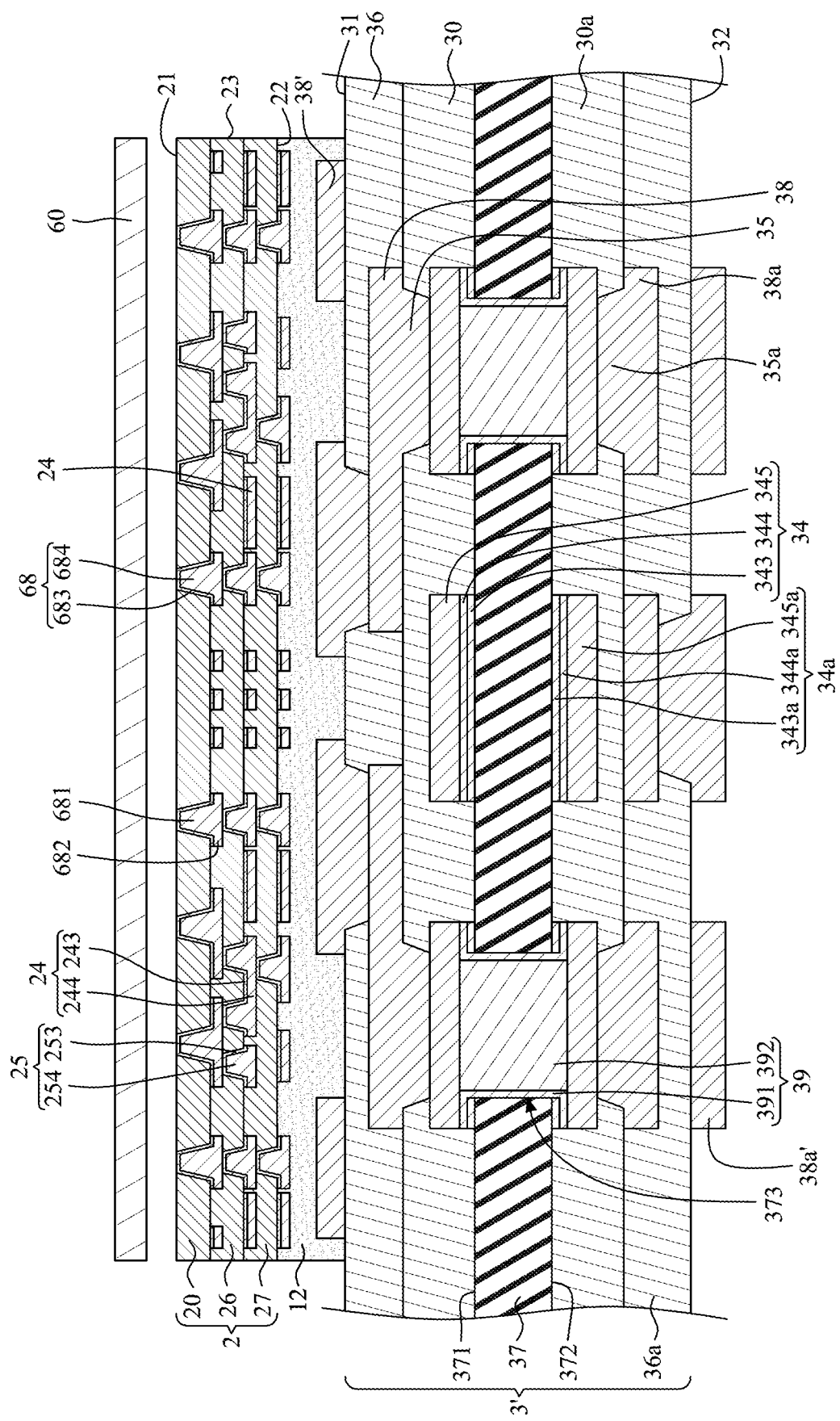
FIG. 24 illustrates one or more stages of an example of a method for manufacturing a wiring structure according to some embodiments of the present disclosure.

Referring to FIG. 24, the carrier 60 is removed.

Figure 25:
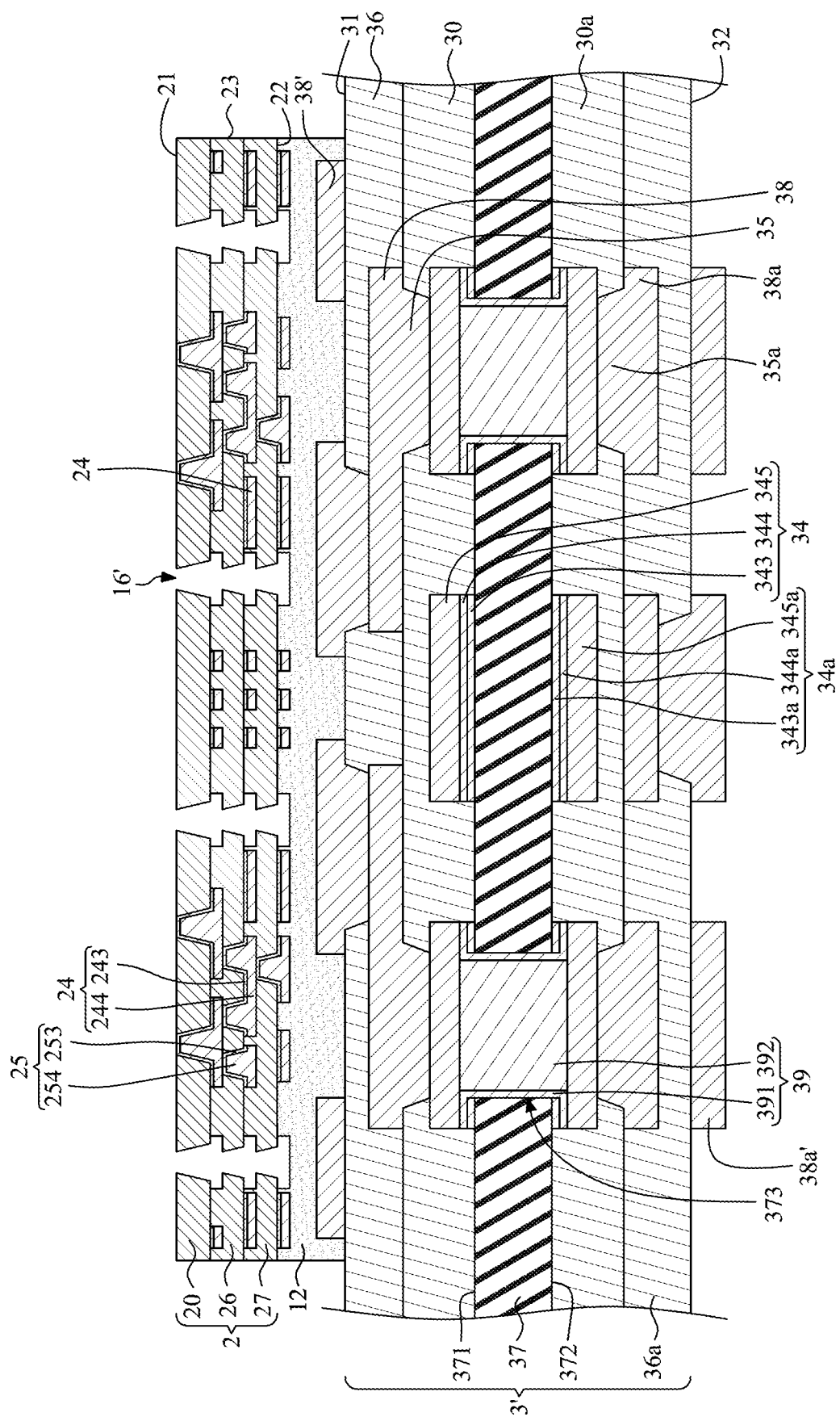
FIG. 25 illustrates one or more stages of an example of a method for manufacturing a wiring structure according to some embodiments of the present disclosure.

Referring to FIG. 25, only the stacking portions 68 are removed to form at least one through hole 16' by, for example, wet etching. It is noted that the circuit layer 24 and the inner conductive via 25 are covered by the dielectric layers 20, 26, 27, and thus, will not be etched.

Figure 26:
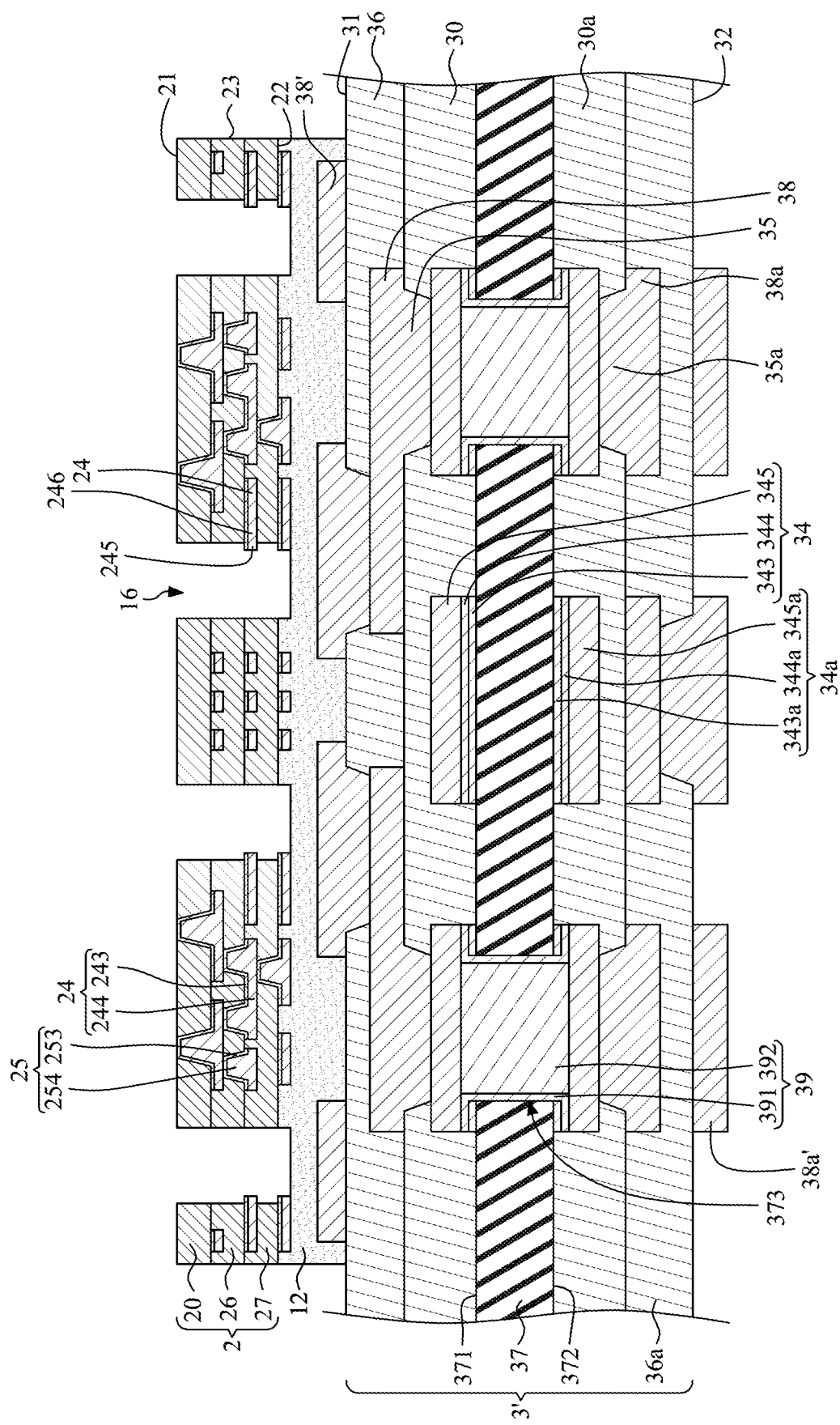
FIG. 26 illustrates one or more stages of an example of a method for manufacturing a wiring structure according to some embodiments of the present disclosure.

Referring to FIG. 26, portions of the dielectric layers 20, 26, 27 of the upper conductive structure 2 near the through hole 16' are removed by, for example, plasma etching. Thus, the through hole 16' is enlarged to form an accommodating hole 16, and a portion (e.g., a first portion 245) of the circuit layer 24 is exposed in the accommodating hole 16. That is, the portion (e.g., the first portion 245) of the circuit layer 24 extends into the accommodating hole 16. Thus, the portion (e.g., the first portion 245) of the circuit layer 24 in the accommodating hole 16 is roughened during the plasma etching process.

Figure 27:
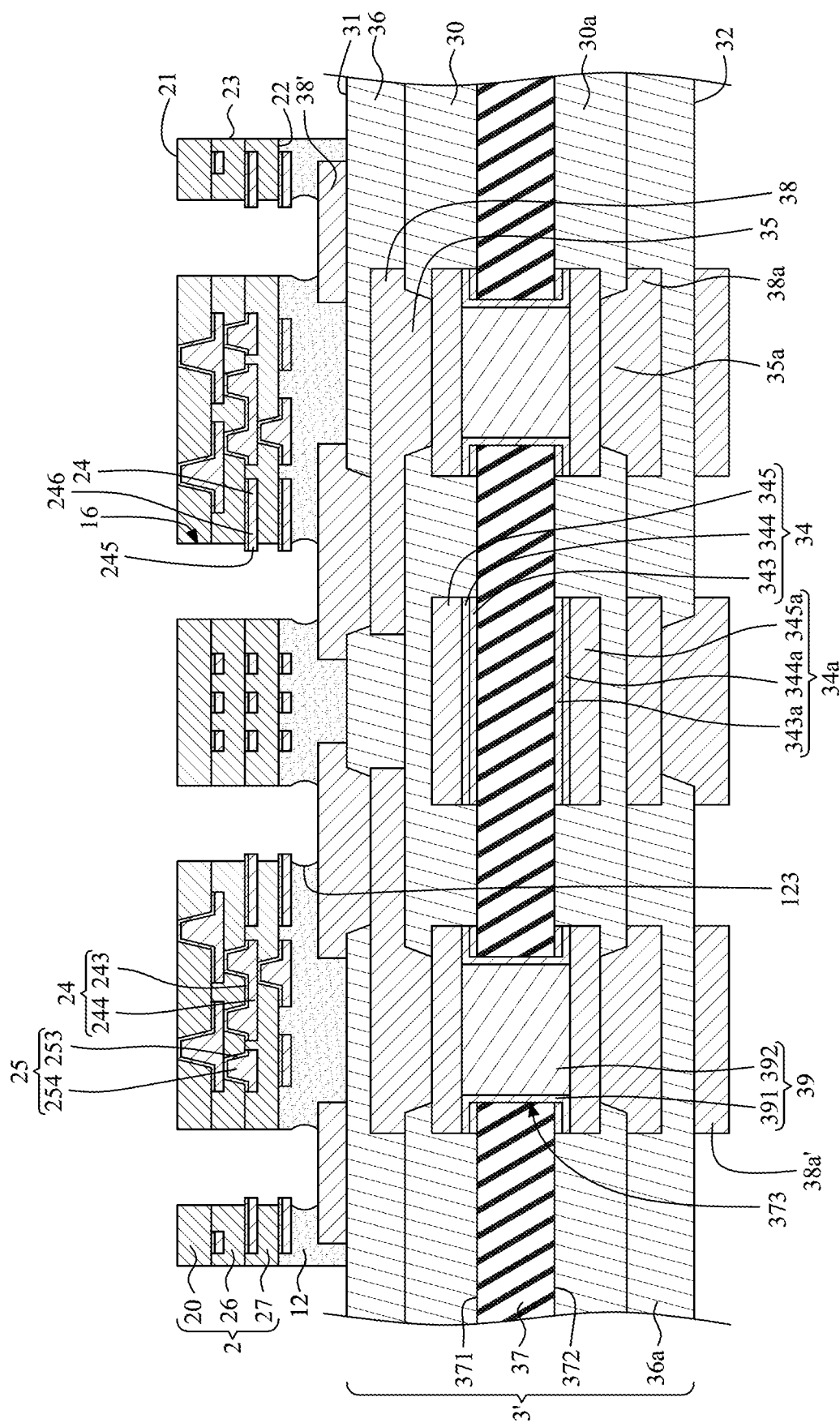
FIG. 27 illustrates one or more stages of an example of a method for manufacturing a wiring structure according to some embodiments of the present disclosure.

Referring to FIG. 27, a portion of the intermediate layer 12 under the accommodating hole 16 is removed to form a through hole 123 in the intermediate layer 12. Thus, the through hole 123 may be aligned with and in communication with the accommodating hole 16 of the upper conductive structure 2. Meanwhile, a portion of the topmost circuit layer (e.g., the top surface of the second upper circuit layer 38') of the lower conductive structure 3' is exposed.

Figure 28:
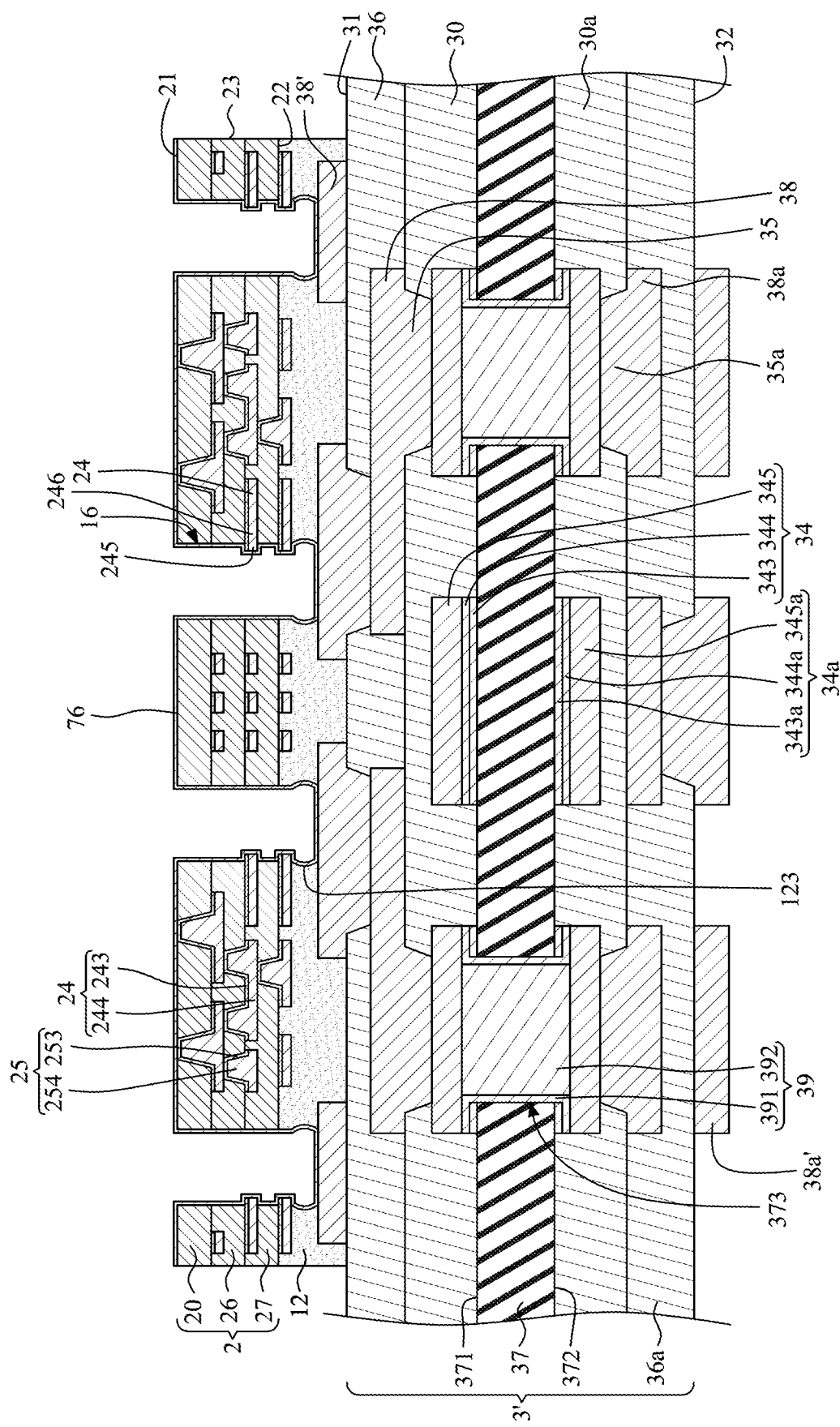
FIG. 28 illustrates one or more stages of an example of a method for manufacturing a wiring structure according to some embodiments of the present disclosure.

Referring to FIG. 28, a seed layer 76 is formed or disposed on the top surface 21 of the upper conductive structure 2, the sidewall of the accommodating hole 16, the sidewall of the through hole 123 of the intermediate layer 12 and the first portion 245 of the circuit layer 24.

Figure 29:
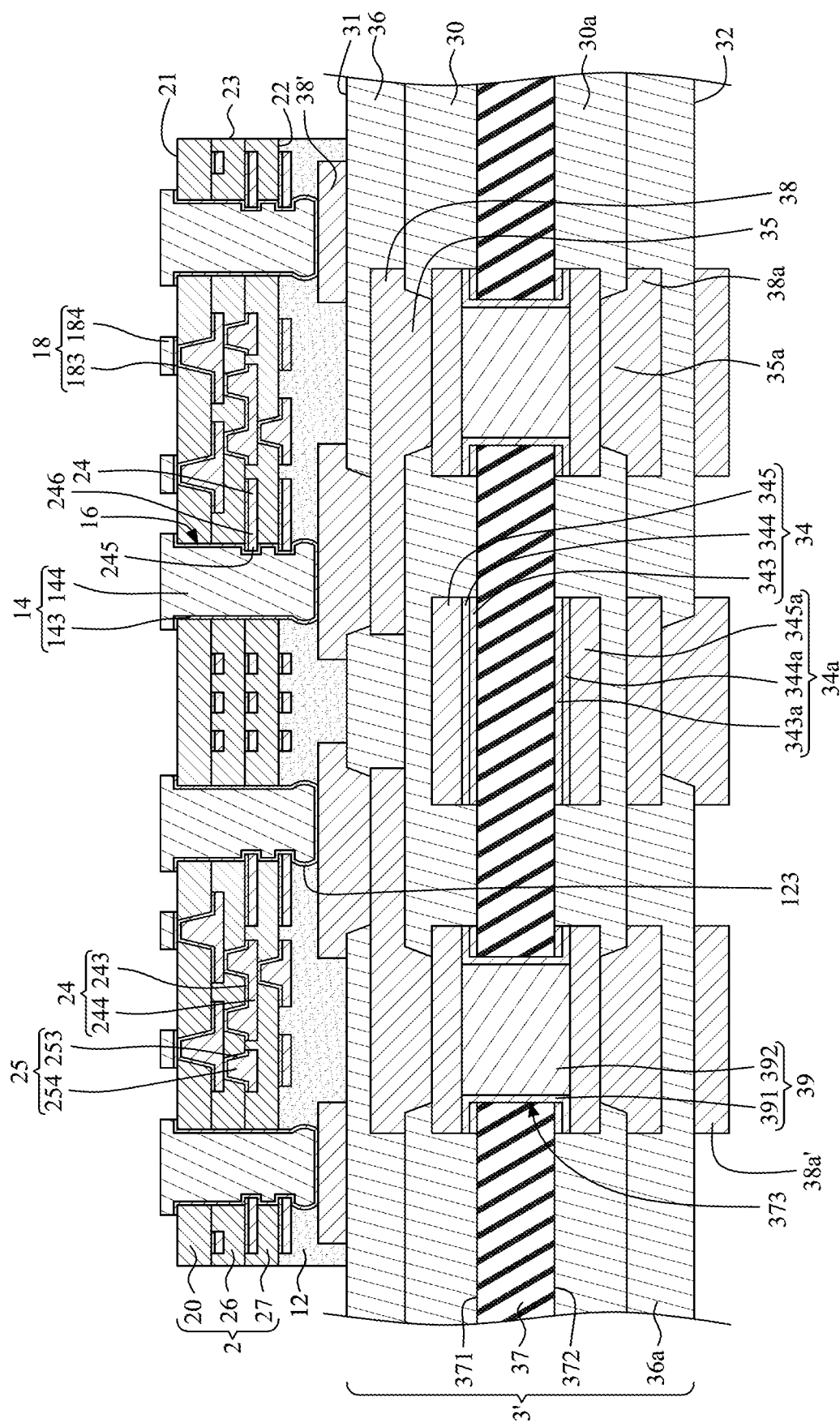
FIG. 29 illustrates one or more stages of an example of a method for manufacturing a wiring structure according to some embodiments of the present disclosure.

Referring to FIG. 29, a patterned conductive material (e.g., a metallic material) is formed or disposed on the seed layer 76 by a plating technique or other suitable techniques. In some embodiments, the patterned conductive material may include, at least one conductive material 144 and at least one conductive material 184. Then, portions of the seed layer 76 that are not covered by the patterned conductive material (including, for example, the conductive material 144 and the conductive material 184) are removed by an etching technique or other suitable techniques.

Meanwhile, at least one conductive through via 14 and an outer circuit layer 18 are formed. The conductive through via 14 may include a seed layer 143 formed from the seed layer 76 and the conductive material 144 on the seed layer 143. The conductive material 144 may fill the accommodating hole 16 of the upper conductive structure 2 and the through hole 123 of the intermediate layer 12. Thus, the conductive through via 14 may extend through the upper conductive structure 2 and the intermediate layer 12, and contacts a portion of the topmost circuit layer (e.g., the top surface of the second upper circuit layer 38') of the lower conductive structure 3'. In addition, the first portion 245 of the circuit layer 24 may be embedded in the conductive through via 14. The outer circuit layer 18 is disposed on the top surface 21 of the upper conductive structure 2, and may include a seed layer 183 formed from the seed layer 76 and the conductive material 184.

Then, the lower conductive structure 3' is singulated so as to obtain the wiring structure 1 of FIG. 1.

Figure 30:
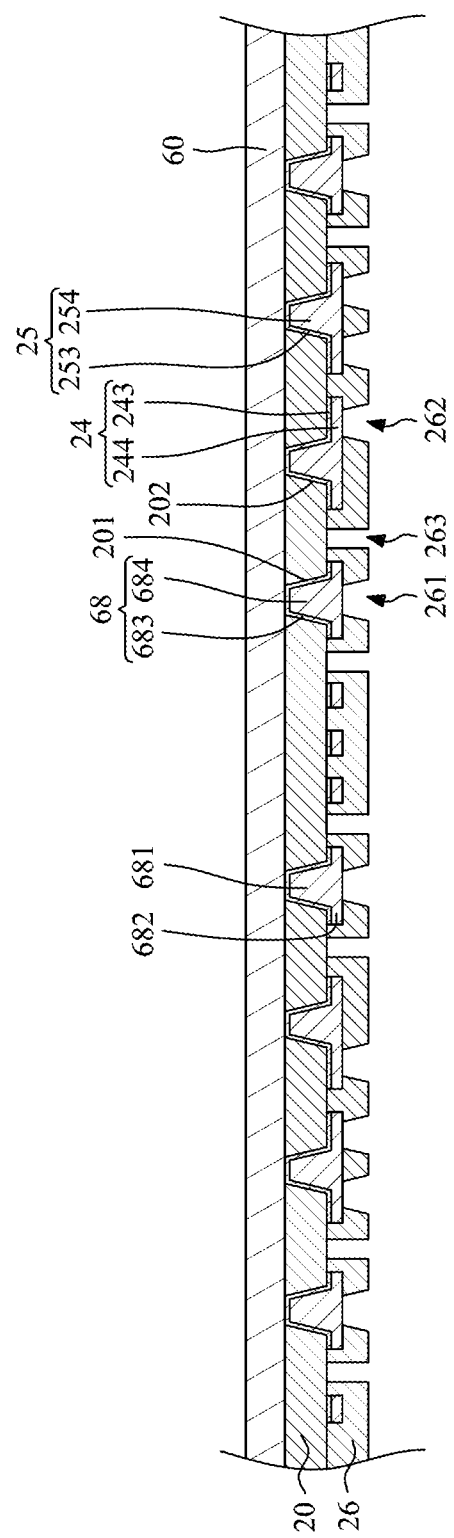
FIG. 30 illustrates one or more stages of an example of a method for manufacturing a wiring structure according to some embodiments of the present disclosure.

FIG. 30 through FIG. 38 illustrate a method for manufacturing a wiring structure according to some embodiments of the present disclosure. In some embodiments, the method is for manufacturing the wiring structure 1c shown in FIG. 6. The initial stages of the illustrated process are the same as, or similar to, the stage illustrated in FIG. 10 to FIG. 15. FIG. 30 depicts a stage subsequent to that depicted in FIG. 15.

Referring to FIG. 30, a patterned second dielectric layer 26 is formed on the first dielectric layer 20 to cover the circuit layer 24 and the stacking portion(s) 68. The patterned second dielectric layer 26 of FIG. 30 is similar to the patterned second dielectric layer 26 of FIG. 16, except that the patterned second dielectric layer 26 of FIG. 30 further defines at least one circular trench 263 surrounding the stacking portion 68 and the first opening 261.

Figure 31:
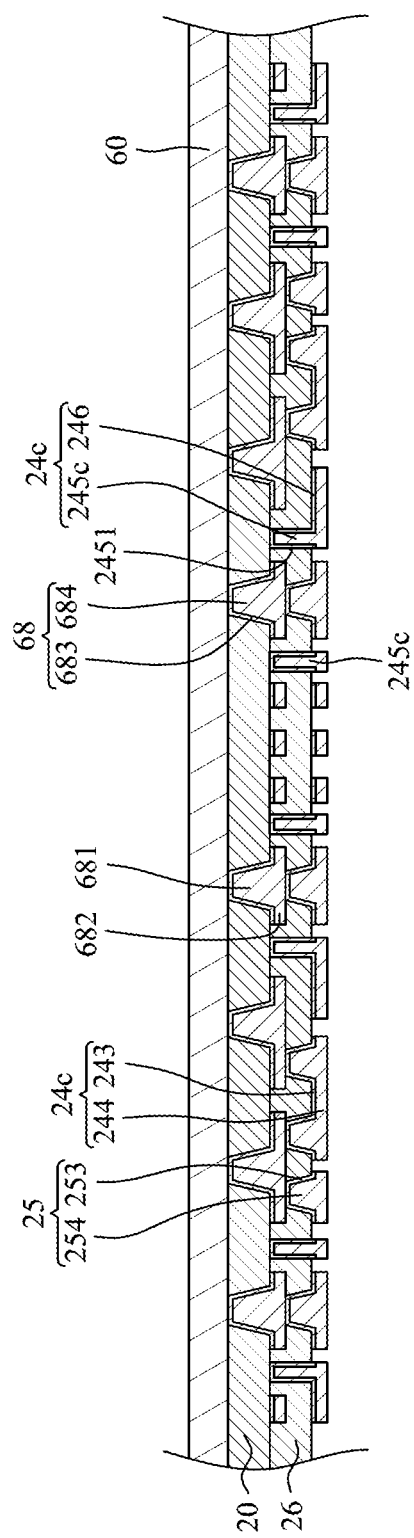
FIG. 31 illustrates one or more stages of an example of a method for manufacturing a wiring structure according to some embodiments of the present disclosure.

Referring to FIG. 31, a circuit layer 24c, at least one inner conductive via 25 and at least one stacking portion 68 are formed. The circuit layer 24c includes a first portion 245c disposed in the circular trench 263. The first portion 245c is a dam portion extending vertically. The first portion 245c is in a substantially closed ring shape and surrounds the stacking portion 68. It is noted that the first portion 245c does not contact the stacking portion 68.

Figure 32:
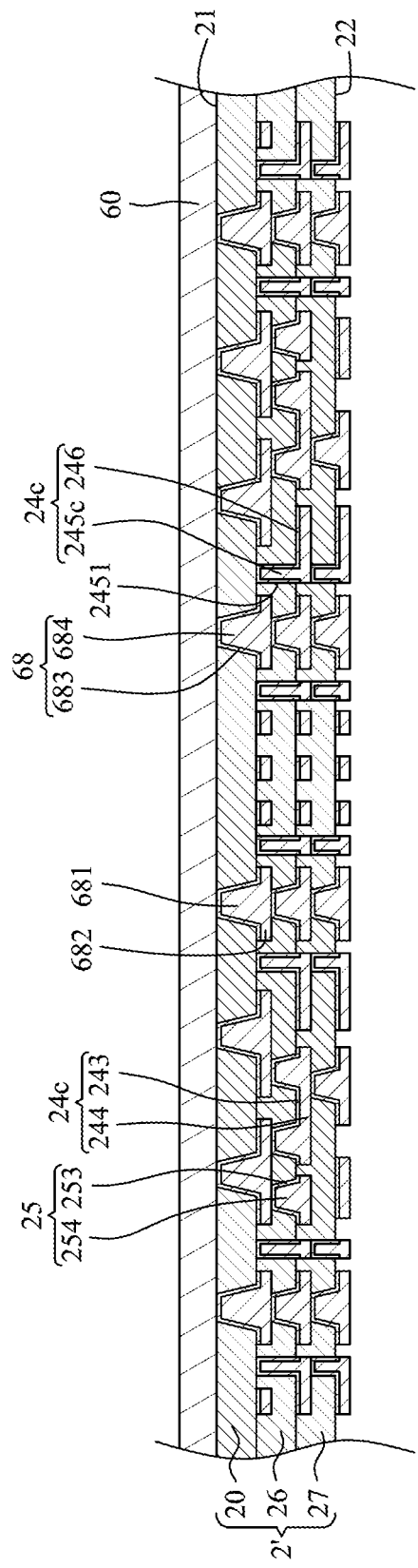
FIG. 32 illustrates one or more stages of an example of a method for manufacturing a wiring structure according to some embodiments of the present disclosure.

Referring to FIG. 32, the stages illustrated in FIG. 30 to FIG. 31 are repeated to form a patterned third dielectric layer 27, the circuit layer 24c on the third dielectric layer 27, the inner conductive via 25 extending through the third dielectric layer 27, and the stacking portion 68 embedded in the third dielectric layer 27. Meanwhile, an upper conductive structure 2' is formed on the carrier 60.

Figure 33:
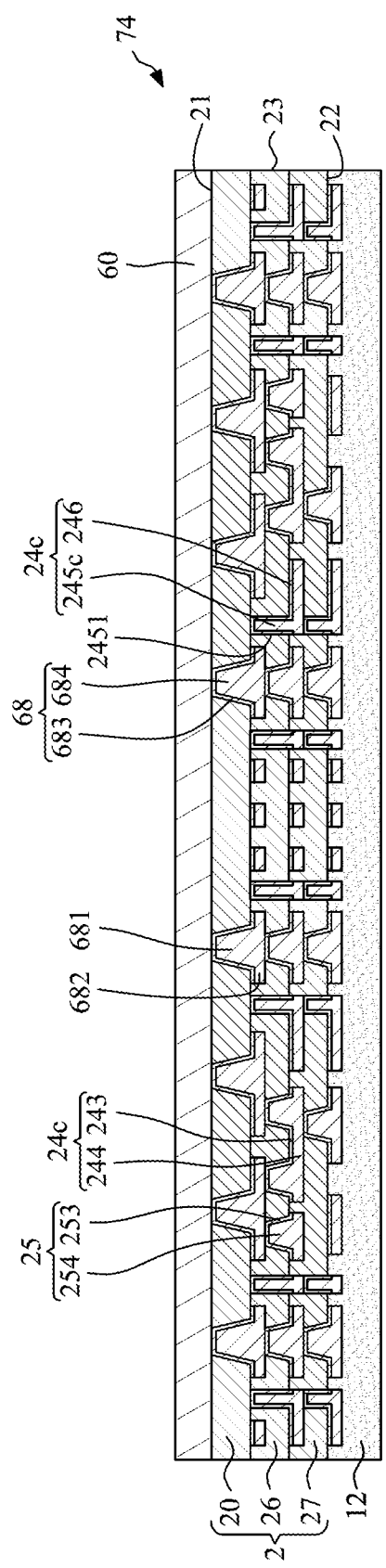
FIG. 33 illustrates one or more stages of an example of a method for manufacturing a wiring structure according to some embodiments of the present disclosure.

Referring to FIG. 33, the upper conductive structure 2', the carrier 60 and the adhesive layer 12 are cut to form a plurality of unit structures 74. The unit structure 74 includes an upper conductive structure 2 and a portion of the carrier 60. The upper conductive structure 2 of FIG. 33 may be the upper conductive structure 2 of FIG. 6. Then, an adhesive layer 12 is formed or applied on the bottom surface 22 of the upper conductive structure 2.

Figure 34:
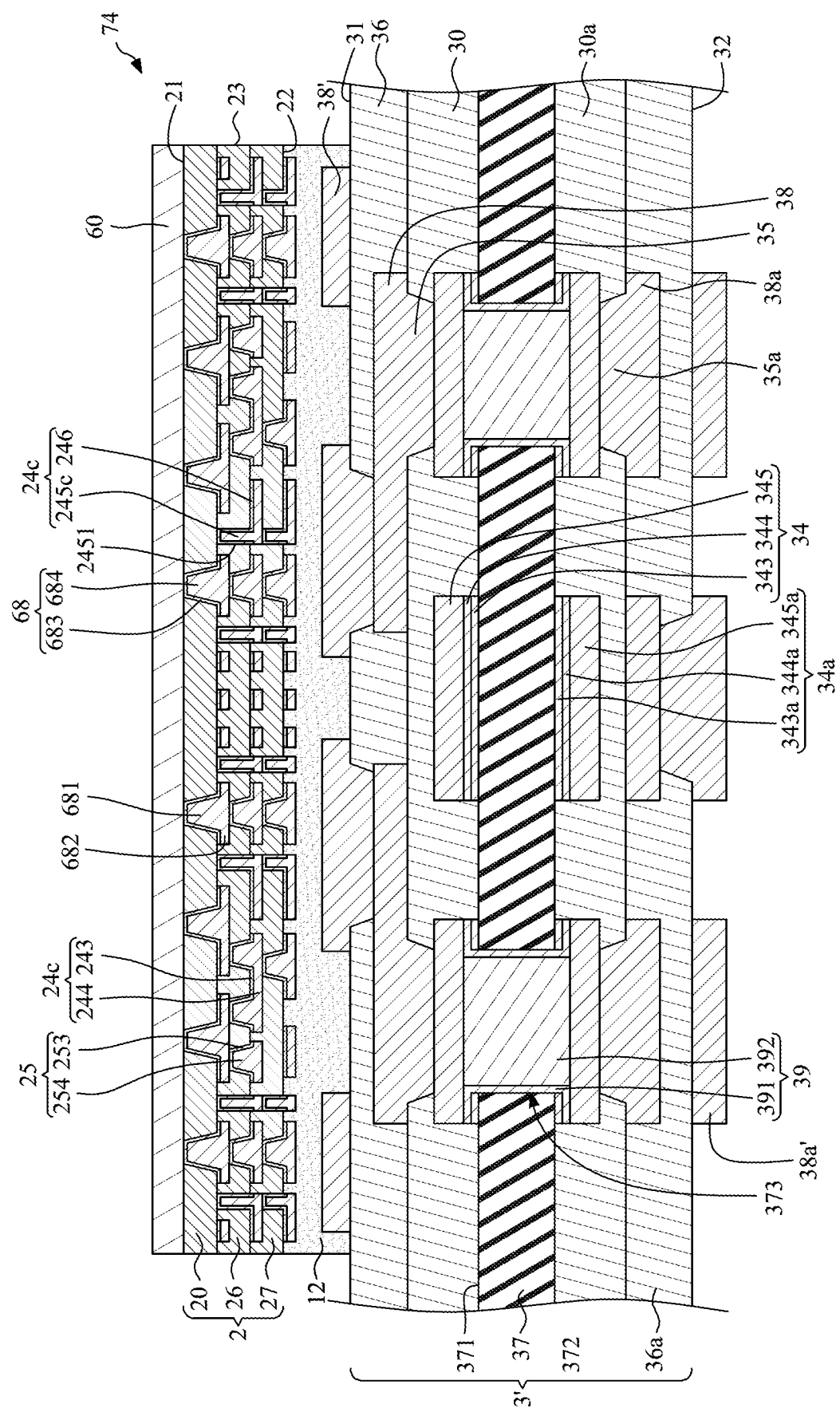
FIG. 34 illustrates one or more stages of an example of a method for manufacturing a wiring structure according to some embodiments of the present disclosure.

Referring to FIG. 34, the unit structure 74 is attached to the lower conductive structure 3' of FIG. 10. Thus, the upper conductive structure 2 is attached to the lower conductive structure 3' through the adhesive layer 12. Then, the adhesive layer 12 is cured to form an intermediate layer 12.

Figure 35:
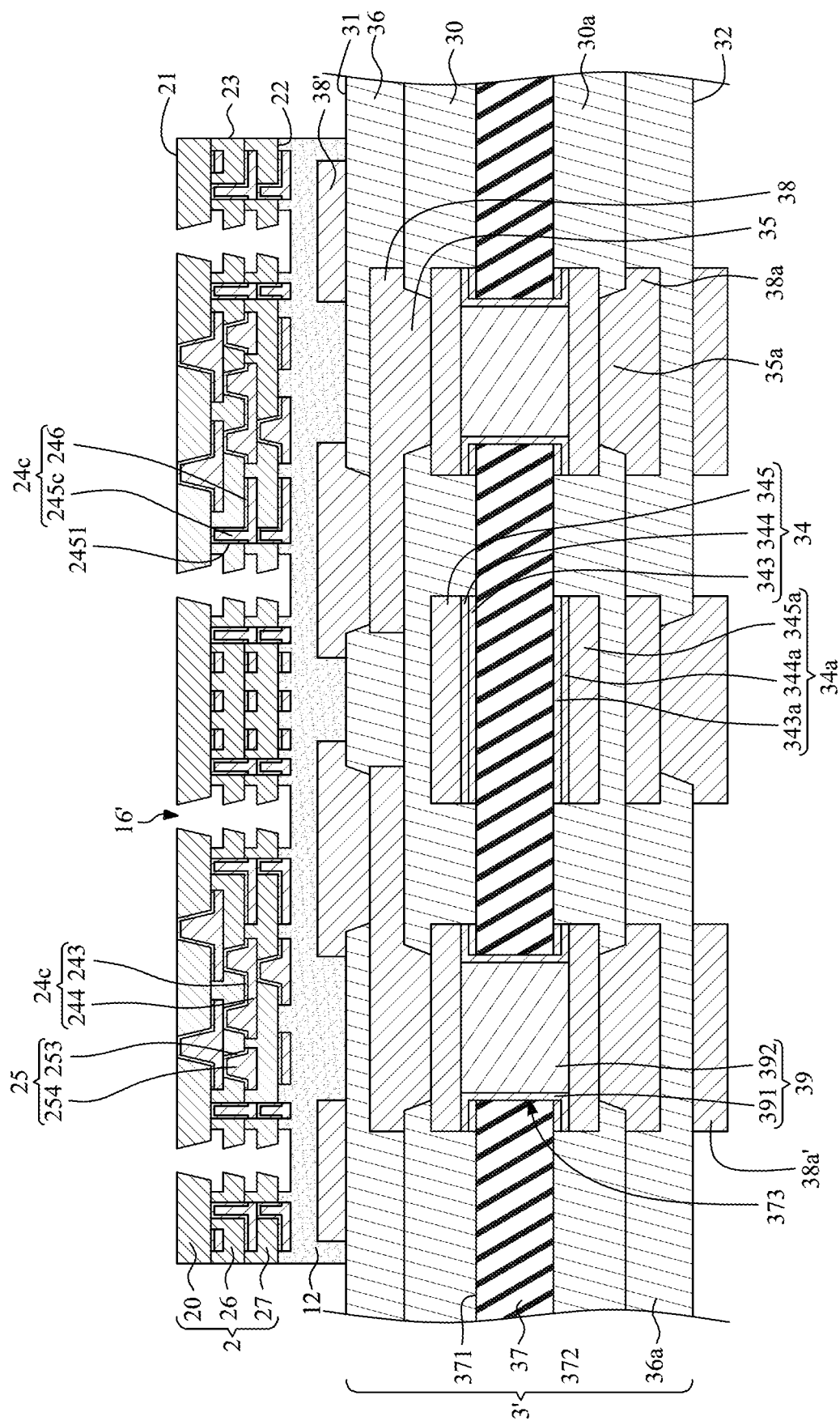
FIG. 35 illustrates one or more stages of an example of a method for manufacturing a wiring structure according to some embodiments of the present disclosure.

Referring to FIG. 35, the carrier 60 is removed. Then, only the stacking portions 68 are removed to form at least one through hole 16' by, for example, wet etching. It is noted that the circuit layer 24c and the inner conductive via 25 are covered by the dielectric layers 20, 26, 27, and thus, will not be etched.

Figure 36:
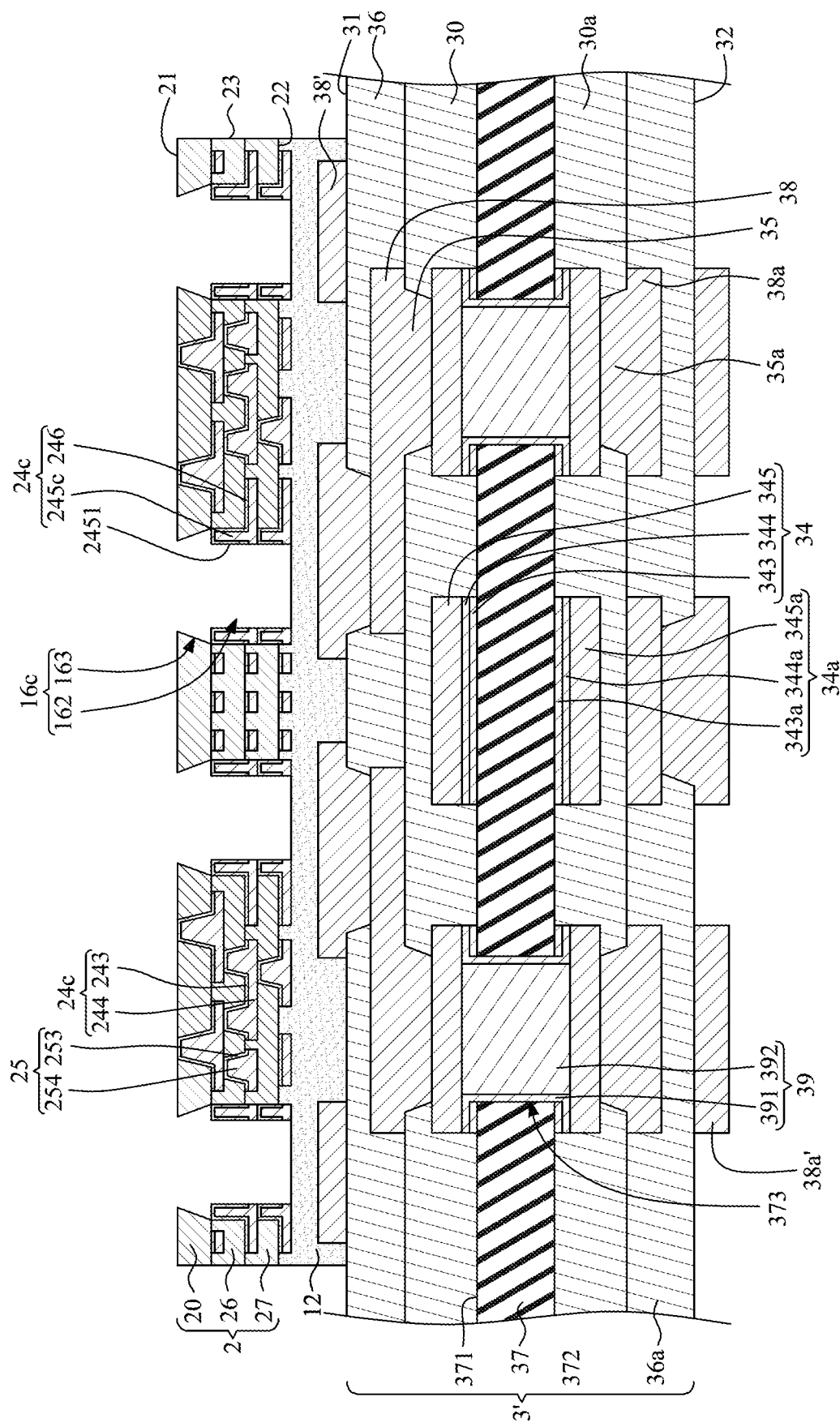
FIG. 36 illustrates one or more stages of an example of a method for manufacturing a wiring structure according to some embodiments of the present disclosure.

Referring to FIG. 36, portions of the dielectric layers 20, 26, 27 of the upper conductive structure 2 near the through hole 16' are removed by, for example, plasma etching. Thus, the through hole 16' is enlarged to form an accommodating hole 16c. The accommodating hole 16c includes a lower portion 162 and an upper portion 163. The lower portion 162 is defined by the inner surface 2451 of the first portions 245c. The upper portion 163 may taper upwardly. It is noted that the inner surface 2451 of the first portion 245c of the circuit layer 24 may be roughened during the plasma etching process.

Figure 37:
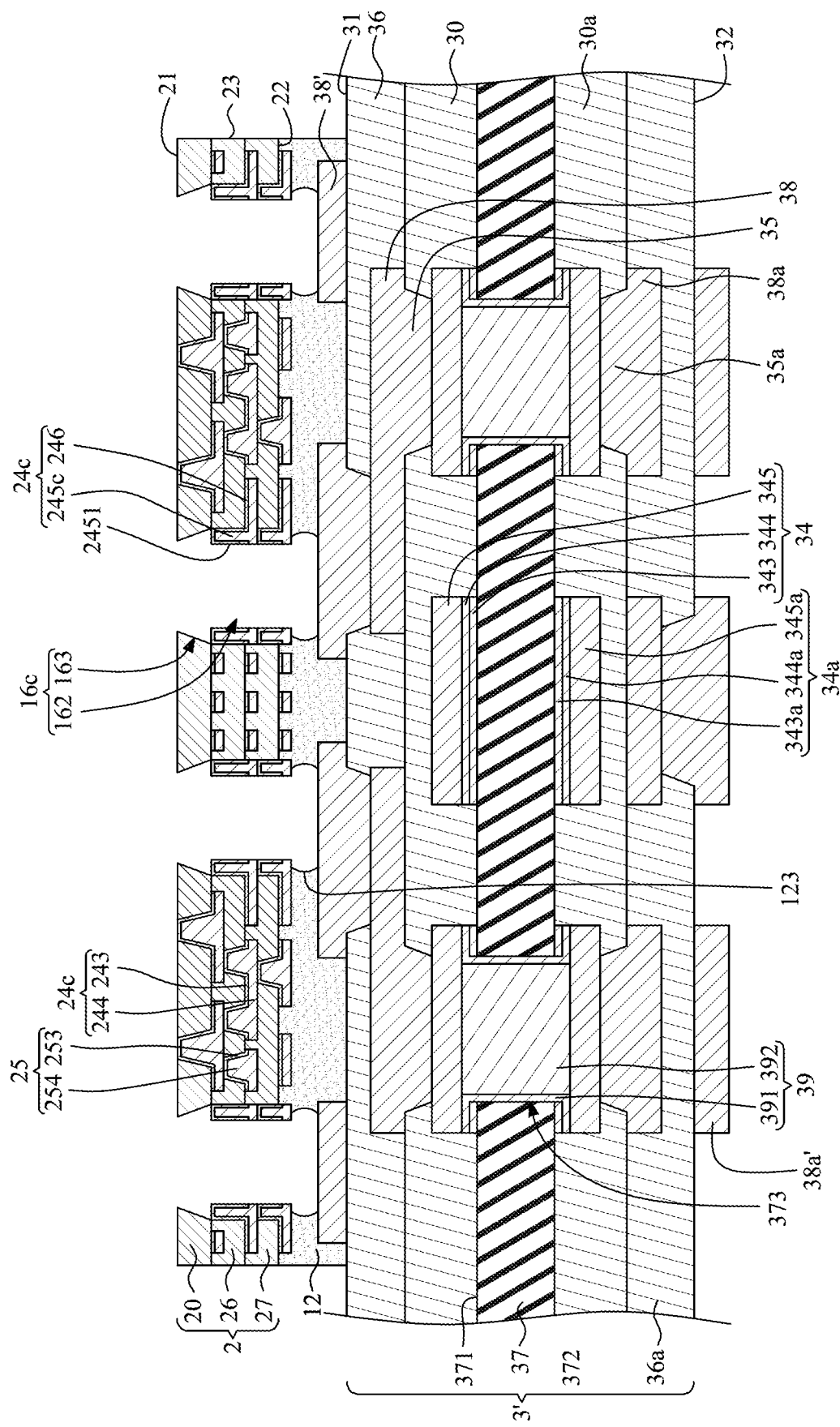
FIG. 37 illustrates one or more stages of an example of a method for manufacturing a wiring structure according to some embodiments of the present disclosure.

Referring to FIG. 37, a portion of the intermediate layer 12 under the accommodating hole 16c is removed to form a through hole 123 in the intermediate layer 12.

Figure 38:
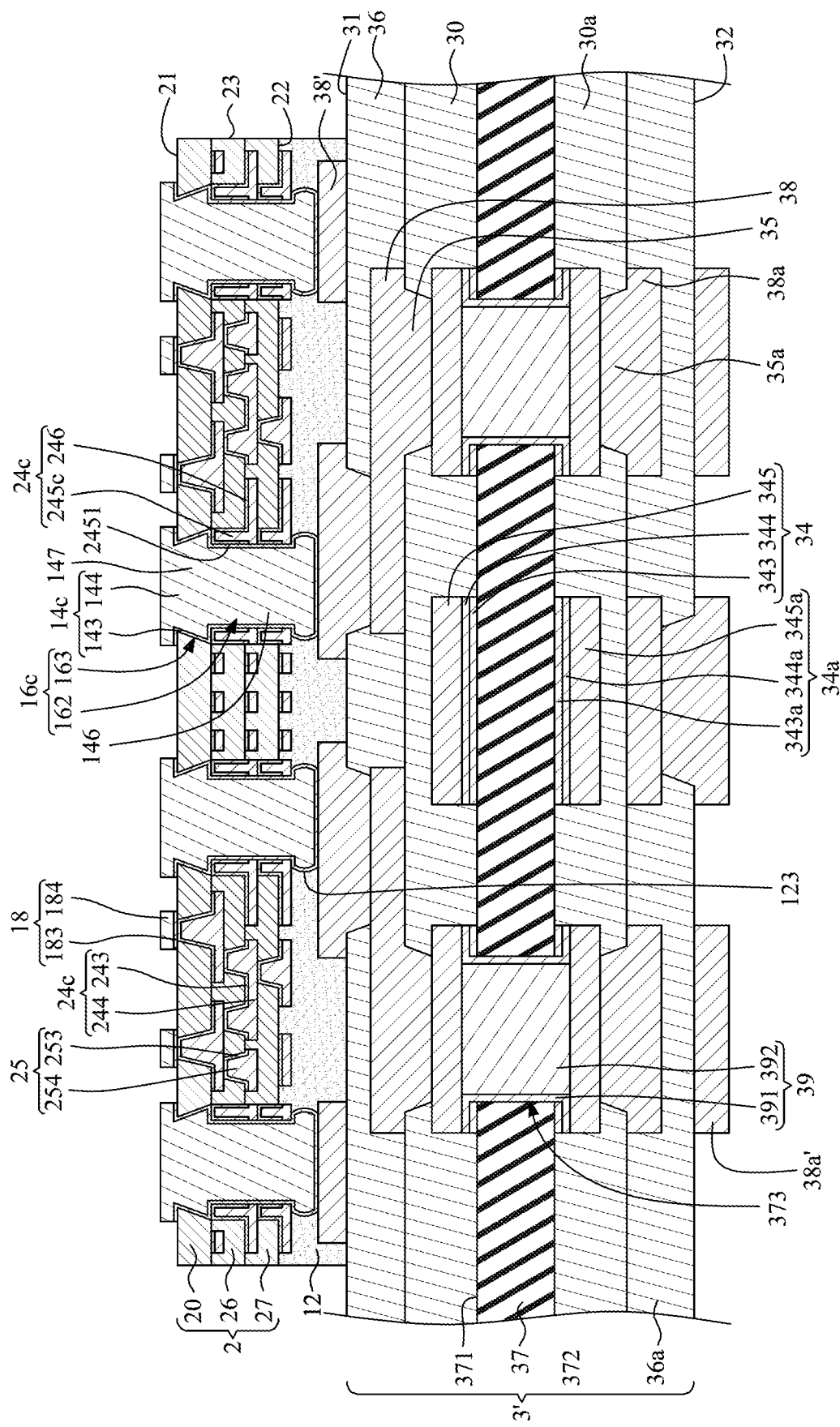
FIG. 38 illustrates one or more stages of an example of a method for manufacturing a wiring structure according to some embodiments of the present disclosure.

Referring to FIG. 38, at least one conductive through via 14c and an outer circuit layer 18 are formed. The conductive through via 14c is disposed in the accommodating hole 16c and in the through hole 123 of the intermediate layer 12, and includes a lower portion 146 and an upper portion 147. The lower portion 146 of the conductive through via 14c is disposed in the lower portion 162 of the accommodating hole 16c, and has a substantially consistent width. The upper portion 147 of the conductive through via 14c is disposed in the upper portion 163 of the accommodating hole 16c, and may taper upwardly.

Then, the lower conductive structure 3' is singulated so as to obtain the wiring structure 1c of FIG. 6.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, a characteristic or quantity can be deemed to be "substantially" consistent if a maximum numerical value of the characteristic or quantity is within a range of variation of less than or equal to +10% of a minimum numerical value of the characteristic or quantity, such as less than or equal to +5%, less than or equal to +4%, less than or equal to +3%, less than or equal to +2%, less than or equal to +1%, less than or equal to +0.5%, less than or equal to +0.1%, or less than or equal to +0.05%.

Two surfaces can be deemed to be coplanar or substantially coplanar if a displacement between the two surfaces is no greater than 5 μm, no greater than 2 μm, no greater than 1 μm, or no greater than 0.5 μm. A surface can be deemed to be substantially flat if a displacement between a highest point and a lowest point of the surface is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A wiring structure, comprising:
   a conductive structure including a plurality of dielectric layers and a plurality of circuit layers in contact with the dielectric layers; and
   at least one conductive through via extending through at least a portion of the conductive structure, wherein at least one of the circuit layers includes a first portion in contact with the conductive through via and a second portion in contact with the dielectric layer, and a surface roughness of the first portion of the circuit layer is greater than a surface roughness of the second portion of the circuit layer, wherein the first portion of the circuit layer includes a dam portion in contact with the dielectric layer, and the at least one conductive through via extends through the dam portion.

2. The wiring structure of claim 1, wherein the surface roughness of the first portion of the circuit layer is greater than two times the surface roughness of the second portion of the circuit layer.

3. The wiring structure of claim 1, wherein a grain size of a material of the first portion of the circuit layer is greater than a grain size of a material of the second portion of the circuit layer.

4. The wiring structure of claim 1, wherein the first portion of the circuit layer is embedded in the conductive through via.

5. The wiring structure of claim 1, wherein the first portion of the circuit layer is a power trace or a ground trace.

6. The wiring structure of claim 1, wherein the dam portion is in contact with an adjacent circuit layer.

7. The wiring structure of claim 1, wherein the dam portion is spaced apart from an adjacent circuit layer.

8. The wiring structure of claim 7, wherein a portion of the conductive through via extends into a gap between the dam portion and the adjacent circuit layer.

9. The wiring structure of claim 1, wherein the dam portion is in a substantially closed ring shape.

10. The wiring structure of claim 1, wherein the dam portion and the second portion of the circuit layer are formed integrally.

11. The wiring structure of claim 1, wherein a surface roughness of an inner surface of the dam portion is greater than the surface roughness of the second portion of the circuit layer.

12. A wiring structure, comprising:
    a lower conductive structure including at least one dielectric layer and at least one circuit layer in contact with the dielectric layer;
    an upper conductive structure disposed on the lower conductive structure, wherein the upper conductive structure includes a plurality of dielectric layers and a plurality of circuit layers in contact with the dielectric layers, wherein a line space of the circuit layer of the lower conductive structure is greater than a line space of the circuit layer of the upper conductive structure; and
    at least one conductive through via extending through at least a portion of the upper conductive structure, and terminating on the circuit layer of the lower conductive structure, wherein at least one of the circuit layers of the upper conductive structure includes a first portion in contact with the conductive through via and a second portion in contact with the dielectric layer of the upper conductive structure, and a surface roughness of the first portion of the circuit layer of the upper conductive structure is greater than a surface roughness of the second portion of the circuit layer of the upper conductive structure, wherein a length of the conductive through via is greater than a thickness of the upper conductive structure.

13. The wiring structure of claim 12, wherein a lateral surface of the upper conductive structure is displaced from a lateral surface of the lower conductive structure.

14. The wiring structure of claim 12, further comprising:
    an intermediate layer disposed between the upper conductive structure and the lower conductive structure and bonding the upper conductive structure and the lower conductive structure together, wherein the conductive through via further extends through the intermediate layer.

15. The wiring structure of claim 14, wherein a topmost circuit layer of the lower conductive structure and a bottommost circuit layer of the upper conductive structure are embedded in the intermediate layer.

16. A wiring structure, comprising:
    a conductive structure including a plurality of dielectric layers and a plurality of conductive layers in contact with the dielectric layers; and
    at least one conductive through via extending through at least a portion of the conductive structure, wherein at least one of the conductive layers includes a first portion extending into the conductive through via and a second portion in contact with the dielectric layer, wherein the first portion of the conductive layer includes a dam portion in contact with the dielectric layer, and the at least one conductive through via extends through the dam portion.

17. The wiring structure of claim 16, wherein the conductive through via includes a seed layer and a conductive material, and the seed layer covers the first portion of the conductive layer.

18. The wiring structure of claim 16, wherein a surface roughnesses of a top surface, a lateral surface and a bottom surface of the first portion are greater than a surface roughness of the second portion respectively.

19. The wiring structure of claim 16, wherein a surface roughness of an inner surface of the dam portion is greater than the surface roughness of the second portion of the conductive layer.

20. The wiring structure of claim 16, wherein the dam portion is in contact with an adjacent conductive layer.

* * * * *